US009105403B2

(12) United States Patent
Yang et al.

(10) Patent No.: US 9,105,403 B2
(45) Date of Patent: Aug. 11, 2015

(54) HIGH-THROUGHPUT SOLUTION PROCESSING OF LARGE SCALE GRAPHENE AND DEVICE APPLICATIONS

(75) Inventors: Yang Yang, Los Angeles, CA (US); Richard B. Kaner, Pacific Palisades, CA (US); Chun-Chih Tung, Los Angeles, CA (US); Matthew J. Allen, Santa Monica, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/747,087

(22) PCT Filed: Jan. 14, 2009

(86) PCT No.: PCT/US2009/031004
§ 371 (c)(1),
(2), (4) Date: Jun. 9, 2010

(87) PCT Pub. No.: WO2009/094277
PCT Pub. Date: Jul. 30, 2009

(65) Prior Publication Data
US 2010/0273060 A1 Oct. 28, 2010

Related U.S. Application Data

(60) Provisional application No. 61/006,447, filed on Jan. 14, 2008, provisional application No. 61/071,579, filed on May 7, 2008, provisional application No. 61/129,698, filed on Jul. 14, 2008.

(51) Int. Cl.
*H01M 4/133* (2010.01)
*C01B 31/04* (2006.01)
(Continued)

(52) U.S. Cl.
CPC ............... *H01G 9/058* (2013.01); *B82Y 10/00* (2013.01); *B82Y 30/00* (2013.01); *B82Y 40/00* (2013.01);
(Continued)

(58) Field of Classification Search
CPC ........ B82Y 30/00; B82Y 40/00; B82Y 20/00; B82Y 10/00; B82Y 99/00; C01B 31/0476; C01B 31/0423; C01B 31/043; C01B 31/04; C01B 31/0469; C01B 31/0206; C01B 2202/22; C01B 2204/04; C01B 2204/22; C01B 2204/30; C01B 31/02
USPC ........................................................ 429/231.8
See application file for complete search history.

(56) References Cited

U.S. PATENT DOCUMENTS

2001/0031900 A1  10/2001  Margrave et al.
2003/0098640 A1   5/2003  Kishi et al.
(Continued)

OTHER PUBLICATIONS

Ago, H. et al., "Composites of carbon nanotubes and conjugated polymers for photovoltaic devices", *Adv. Mater.* vol. 11, pp. 1281-1286 (1999).
(Continued)

*Primary Examiner* — Patrick Ryan
*Assistant Examiner* — Lucas J O'Donnell
(74) *Attorney, Agent, or Firm* — Venable LLP; Henry J. Daley; F. Brock Riggs

(57) ABSTRACT

A method of producing carbon macro-molecular structures includes dissolving a graphitic material in a solvent to provide a suspension of carbon-based macro-molecular structures in the solvent, and obtaining a plurality of the carbon macro-molecular structures from the suspension. The plurality of carbon macro-molecular structures obtained from the suspension each consists essentially of carbon. A material according to some embodiments of the current invention is produced according to the method of producing carbon macro-molecular structures. An electrical, electronic or electro-optic device includes material produced according to the methods of the current invention. A composite material according to some embodiments of the current invention has carbon macro-molecular structures produced according to methods of producing carbon macro-molecular structures according to some embodiments of the current invention. A hydrogen storage device according to some embodiments of the current invention has carbon macro-molecular structures produced according to methods of producing carbon macro-molecular structures according to some embodiments of the current invention. An electrode according to some embodiments of the current invention has carbon macro-molecular structures produced according to methods of producing carbon macro-molecular structures according to some embodiments of the current invention.

29 Claims, 15 Drawing Sheets

(51) Int. Cl.

| | |
|---|---|
| H01G 9/04 | (2006.01) |
| B82Y 10/00 | (2011.01) |
| B82Y 30/00 | (2011.01) |
| B82Y 40/00 | (2011.01) |
| H01G 11/36 | (2013.01) |
| H01M 4/96 | (2006.01) |
| H01L 51/00 | (2006.01) |
| H01L 51/05 | (2006.01) |

(52) U.S. Cl.
CPC ............ *C01B 31/0469* (2013.01); *H01G 11/36* (2013.01); *H01M 4/96* (2013.01); *C01B 2204/02* (2013.01); *H01L 51/0003* (2013.01); *H01L 51/0048* (2013.01); *H01L 51/0541* (2013.01); *H01L 51/0545* (2013.01); *Y02E 60/13* (2013.01); *Y02E 60/50* (2013.01)

(56) References Cited

U.S. PATENT DOCUMENTS

| | | | |
|---|---|---|---|
| 2005/0266605 A1 | 12/2005 | Kawakami | |
| 2007/0131915 A1* | 6/2007 | Stankovich et al. | 252/511 |
| 2007/0284557 A1* | 12/2007 | Gruner et al. | 252/500 |
| 2009/0071533 A1* | 3/2009 | Choi et al. | 136/252 |
| 2010/0096595 A1* | 4/2010 | Prud'Homme et al. | 252/500 |
| 2010/0096597 A1* | 4/2010 | Prud'Homme et al. | 252/511 |
| 2010/0147188 A1* | 6/2010 | Mamak et al. | 106/31.13 |
| 2010/0273060 A1 | 10/2010 | Yang et al. | |

OTHER PUBLICATIONS

Arias, A. C. et al., "All jet-printed polymer thin-film transistor active-matrix backplanes", *Appl. Phys. Lett.* 2004, vol. 85, pp. 3304-3306.
Becerril, H. et al., "Evaluation of solution-processed reduced graphene oxide films as transparent conductors", Nano ASAP.
Berger, C. et al., "Ultrathin Epitaxial Graphite: 2D Electron Gas Properties and a Route toward Graphene-based Nanoelectronics", *J. of Phys. Chem. B* 2004, vol. 108(52), pp. 19912-19916.
Berger, C. et. al., "Electronic confinement and coherence in patterned epitaxial graphene", *Science* 2006, vol. 312(5777), pp. 1191-1196.
Bourlinos, A. B. et al., *Langmuir* 2003, vol. 19(15), pp. 6050-6055.
Briseno, A. L.et al., "Patterning organic semiconductors using "dry" poly(dimethylsiloxane) elastomeric Stamps for thin film transistors", *J. Am. Chem. Soc.* 2004, vol. 126, pp. 13928-13929.
Calizo I.et al., *Nano Lett.*, vol. 7, No. 9 (2007), pp. 2645-2649.
Chabinyc, M. L. et al., "Lamination Method for the Study of Interfaces in Polymeric Thin Film Transistors", *J. Am. Chem. Soc.* 2004, vol. 126, pp. 13928-13929.
Chabinyc, M. L. et al., "Organic polymeric thin-film transistors fabricated by selective dewetting", *Appl. Phys.Lett.* 2002, vol. 81, pp. 4260-4262.
Dettleff-Weglikowska, U. et al., "Effect of $SOCl_2$ treatment on electrical and mechanical property of single-wall carbon nanotube networks", *J. Am. Chem. Soc* vol. 127, pp. 5125-5131 (2005).
Eda, G. et al. "Transparent and conducting electrodes for organic electronics from reduced graphene oxide", *Applied Phys. Lett.* vol. 92, pp. 233305-233308 (2008).
Eda, G. et al., "Large-area ultrathin films of reduced graphene oxide as a transparent and flexible electronic matrial", *Nature Nanotech.* vol. 3, pp. 270-274 (2008).
Ferrari, A. C.et al., "Raman spectrum of Graphene and graphene layers", *Phys. Rev. Lett.* 2006, vol. 97, pp. 87401-187404.
Geim, K. S. et al., "Electric Field Effect in Atomically Thin Carbon films", *Science* 2004, vol. 306 (5696), pp. 666-669.
Gilje, S. et al., "A chemical route to graphene for device applications", *Nano lett.* 2007, vol. 7, pp. 3394-3398.
Glasmastar, K.et al., "Silcone Transfer during microcontact printing", *Langmuir* 2003, vol. 19, pp. 5475-5483.
Gomez-Navarro, C. et al, "Electronic transport properties of individual chemically reduced graphene Oxide Sheets *Nano lett*", 2007, vol. 7, pp. 3499-3503.

Graf, D. et al., "Spatially Resolved raman spectroscopy of single- and few-layer graphene", *Nano Lett.* 2007, vol. 7, pp. 238-242.
Gupta, A.et. al., "Raman scattering from high-frequency phonons in supported n-graphene layer films", *Nano Lett.* 2006, vol. 6, pp. 2667-2673.
Gusynin V. P et al., "Unconventional integer quantum Hall effect in graphene", *Phys. Rev. Lett.* vol. 95, pp. 146801-146804 (2005).
Gómez-Navarro, C. et al., "Transport Properties of Individual Chemically Reduced Graphene Oxide Sheets *Nano lett*", 2007, vol. 7, pp. 3499-3503.
Hernandez, Y. et al., "High-yield production of graphene by liquid-phase exfoliation of graphite", *Nature Nanotech.* vol. 3, pp. 563-568 (2008).
Hu, L.et al., "Patternable transparent carbon nanotube films for electrochromic devices", *Journal of Applied Physics*, vol. 101, pp. 016102-016104 (2007).
Hu, L.et al., "Percolation in transparent and conducting carbon nanotube networks", *Nano Lett.* vol. 4, pp. 2513-2517 (2004).
Hummers, W. S., Jr. et al., *J. Am. Chem. Soc.* 1958, vol. 80, pp. 1339.
Hur, S.-H.et al., "Nanotranser printing by use of Noncovalent surface forces: applications to thin film transistors that us single walled carbon nanotube networks and semicondcting polymers", *Appl. Phys.Lett.* 2004, vol. 85, pp. 5730-5733.
Ishigami M. et al., *Nano Lett.* 2007, vol. 7, pp. 1643-1648.
Jung, D.et al., *Nano Lett.* 2008, DOI:10.1021/nl8019938.
Kawase, T. et al., "Inkjet Printed Via-Hole Interconnections and Resistors for All-Polymer Transistor Circuits *Adv. Mater*", 2001, vol. 13, pp. 1601-1605.
Lefenfeld, M. et. al, "High-Performance Contacts in Plastic Transistors and Logic Gates That Use Printed Electrodes of DNNSA-PANI Doped with Single-Walled Carbon Nanotubes", *Adv. Mater.* 2003, vol. 15, pp. 1188-1191.
Li, D.et al., "Processable aqueous dispersion of graphene nanosheets", *Nature Nanotech.* vol. 3, pp. 101-106 (2008).
Li, J.et al., "Organic light-emitting diodes having carbon nanotube anodes", *Nano Lett.* vol. 6, pp. 2472-2477 (2006).
Li, X.-M.et al., "Catalytic microcontact printing without ink", *Nano lett.* 2003, vol. 3, pp. 1449-1453.
Li, X.et al., "Chemically derived, ultrasmooth graphene nanoribbon semiconductors", Science, vol. 319, pp. 1229-1232 (2008).
Ferrari, A.C. et al., *Phys. Rev. Lett.* 2006, vol. 97, pp. 187401-187404.
Mitzi B. D. et al., "Low-Voltage Transistor Employing a High-mobility spin-coated chalcogenide semiconductor", *Adv Mater.* 2005, vol. 17, pp. 1289-1293.
Novoselov K. S.et al., *Science* 2004, vol. 306 (5696), pp. 666-669.
Novoselov, K. S. et al., "Room-Temperature Quantum Hall Effect in Graphene", *Science* 2007, vol. 315(5817), pp. 1379.
Novoselov, K. S. et al., "Two-dimensional gas of massless Dirac fermions in graphene", *Nature* 2005, vol. 438(7065), pp. 197-200.
Novoselov, K. S. et al., "Unconventional quantum Hall effect and Berry's phase of 2pi in bilayer graphene", *Nature Physics* 2006, vol. 2(3), pp. 177-180.
Pasquier, A. D. et al., "Conducting and transparent single-wall carbon nanotube electrodes for polymer-fullerene solar cells", *Applied. Phys. Lett.* vol. 87, pp. 203511-203513 (2005).
Reich S.et al., *Phil. Trns. R. Soc. Lond.* A 2004, vol. 362, pp. 2271-2288.
Rowell, M. W. et al., "Organic solar cells with carbon nanotube network electrodes", *Applied Phys. Lett.* vol. 88, pp. 233506-233509 (2006).
Schniepp C. H. et al., *J. Phys. Chem. B* 2006, vol. 110, pp. 8535-8539.
Shioyama, H.et al., "A new route to carbon nanotubes", *Carbon* 2003, vol. 41(1), pp. 179-181.
Stankovich, S. et al., "Synthesis of graphene-based nanosheets via chemical reduction of exfoliated graphite oxide Carbon.", 2007, vol. 45, pp. 1558-1565.
Stankovich, S.et al., "Synthesis and exfoliation of isocyanate-treated graphene oxide nanoplatelets", *Carbon* 2006, vol. 44, pp. 1558-1565.
Tuinstra F.et al., *J. Chem. Phys.* 1970, vol. 53, pp. 1126-1130.
Tuinstra, F. et al., "Raman spectrum of graphite", *J. Chem. Phys.* 1970, vol. 53, pp. 1126-1130.
Tung, V. C. et al., "High throughput solution processing of large scale graphene", *Nature Nanotech*, doi:10.1038/nnano. 2008 pp. 329.

(56) References Cited

OTHER PUBLICATIONS

Viculis, L. M. et. al., "A Chemical route to carbon nanoscrolls", *Science* 2003, vol. 299(5611), pp. 1361.

Watcharotone, S. et al., "Graphene-Silica composite thin films as transparent conductors", *Nano Lett*. vol. 7, pp. 1888-1892 (2007).

Wu, Z. et al. "Transparent conductive carbon nanotube film", *Science*, vol. 305, pp. 1273-1277 (2004).

Zhang, D. et al., "Transparent, conductive, and flexible carbon nanotube films and their application in organic light-emitting diodes", *Nano Lett*. vol. 6, pp. 1880-1886 (2006).

Zhang, Y.; Tan, Y.W.; Stormer, H. L.; Kim, P.; Experimental observation of the quantum Hall effect and Berry's phase in graphene. *Nature* 2005, 438(7065), 201-204.

International Search Report and Written Opinion for Application No. PCT/US09/31004, filed Jan. 14, 2009.

\* cited by examiner

Figure 3a
Figure 3b
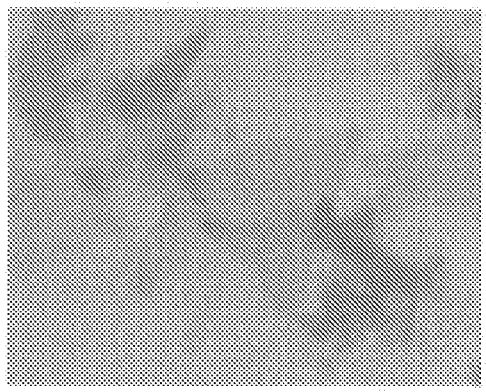
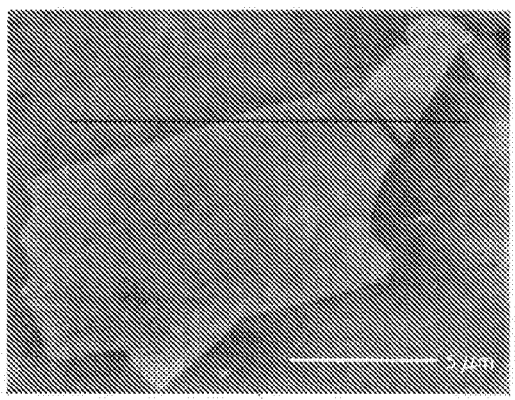
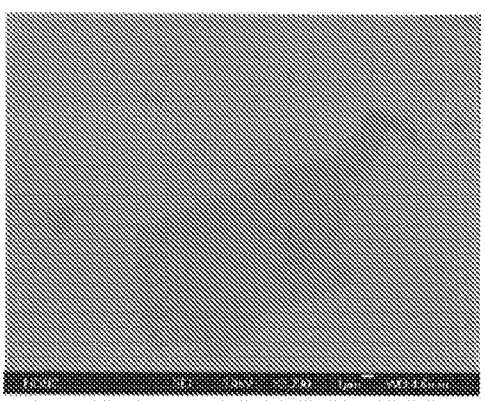
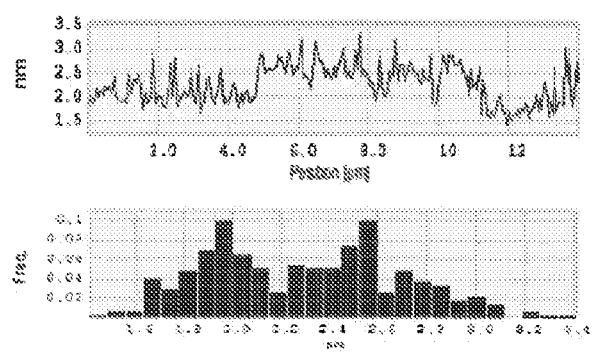
Figure 3c
Figure 3d

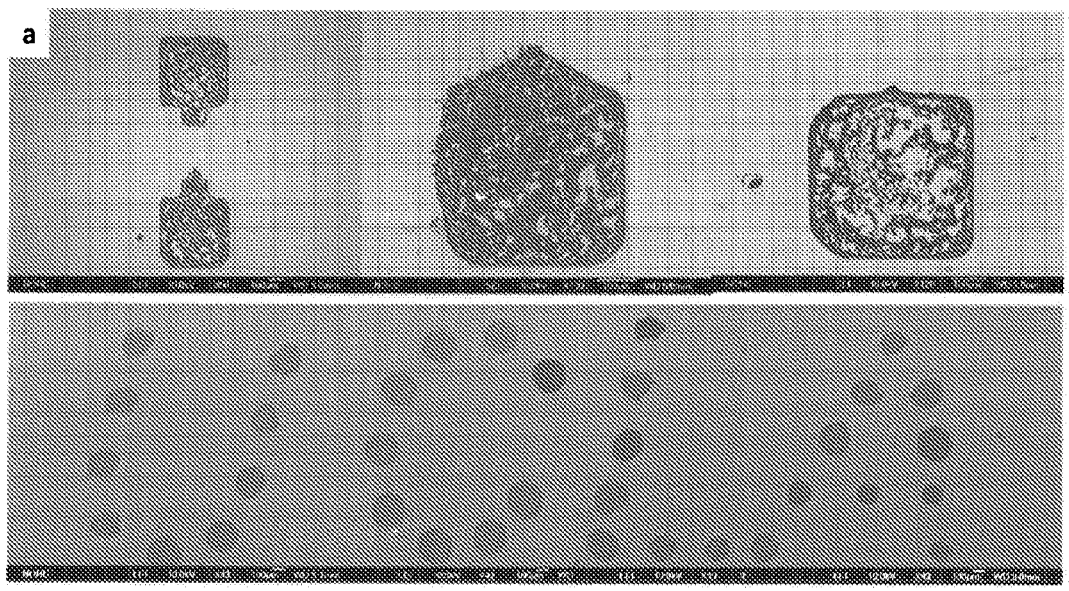
Figure 10a
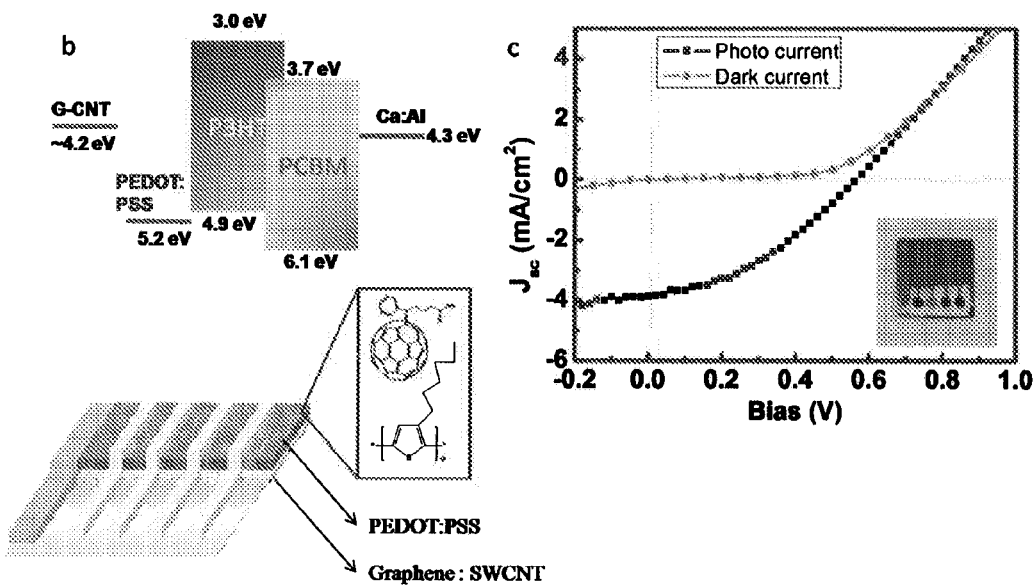
Figure 10b
Figure 10c

HIGH-THROUGHPUT SOLUTION PROCESSING OF LARGE SCALE GRAPHENE AND DEVICE APPLICATIONS

This application is a U.S. National Phase of International Application No. PCT/US2009/031004, filed Jan. 14, 2009, and which claims Priority to U.S. Provisional Application Nos. 61/006,447, 61/071,579, and 61/129,698 filed Jan. 14, 2008, May 7, 2008, and Jul. 14, 2008, respectively, the entire contents of which are hereby incorporated by reference.

This invention was made with Government support of Grant No. 0507294 awarded by the National Science Foundation and of Grant No. FA9550-07-1-0264, awarded by the United States Air Force Office of Scientific Research. The Government has certain rights in this invention.

BACKGROUND

1. Field of Invention

The current invention relates to methods of producing graphene and devices and methods of producing the devices using graphene, and more particularly to high-throughput solution processing of graphene and devices and methods of producing the devices using the graphene.

2. Discussion of Related Art

Since its experimental discovery in 2003, there has been a great amount of interest in single layer graphene for a variety of applications. Ballistic transport of electrons along the atomically thin layer, along with mobilities exceeding 15,000 $cm^2/Vs$ and an ambipolar field effect make graphene a particularly good candidate for the next round of semiconductor devices (Novoselov, K. S.; Geim, A. K.; Morozov, S. V.; Jiang, D.; Zhang, Y.; Dubonos, S. V.; Grigorieva, I. V.; Firsov, A. A.; Electric Field Effect in Atomically Thin Carbon films. *Science* 2004, 306 (5696), 666-9; Gusynin, V. P.; Sharapov, S. G.; Unconventional Integer Quantum Hall Effect in Graphene, *Phys. Rev. Lett.* 2005, 95(14), 146801; Zhang, Y.; Tan, Y. W.; Stormer, H. L.; Kim, P.; Experimental observation of the quantum Hall effect and Berry's phase in graphene. *Nature* 2005, 438(7065), 201-204; Novoselov, K. S.; McCann, E.; Morozov, S. V.; Fal'ko, V. I.; Katsnelson, M. I.; Zeitler, U.; Jiang, D.; Schedin, F.; Geim, A. K.; Unconventional quantum Hall effect and Berry's phase of 2pi in bilayer graphene. *Nature Physics* 2006, 2(3), 177-180; Novoselov, K. S.; Jiang, Z.; Zhang, Y.; Morozov, S. V.; Stormer, H. L.; Zeitler, U.; Boebinger, G. S.; Kim, P.; Geim, A. K.; Room-Temperature Quantum Hall Effect in Graphene. *Science* 2007, 315(5817), 1379; Novoselov, K. S.; Geim, A. K.; Morozov, S. V.; Jiang, D.; Katsnelson, M. I.; Grigorieva, I. V.; Dubonos, S. V.; Firsov, A. A.; Two-dimensional gas of massless Dirac fermions in graphene. *Nature* 2005, 438(7065), 197-200).

Although similarities to carbon nanotubes and other conjugated systems help contribute to the theoretical understanding of graphene, experimental results have been less forthcoming due to the difficulty in producing single layer specimens. As with carbon nanotubes, the large aspect ratio of individual sheets, and strong Van der Waals forces holding them together, make isolating single sheets of graphene very challenging.

Thus far only two methods have enjoyed reliable success; the Scotch tape or "drawing" method and by the reduction of silicon carbide (Novoselov, K. S.; Geim, A. K.; Morozov, S. V.; Jiang, D.; Katsnelson, M. I.; Grigorieva, I. V.; Dubonos, S. V.; Firsov, A. A.; Two-dimensional gas of massless Dirac fermions in graphene. *Nature* 2005, 438(7065), 197-200).

The drawing method utilizes a piece of Scotch tape to draw a thin film from highly oriented pyrolytic graphite (HOPG). After repeated peeling from the thin film, it is ultimately stamped onto a substrate and the tape is carefully removed. The resulting deposition is a dense network of both single and multi-layered graphene, which must be scoured using an optical microscope and otherwise characterized before finally a single sheet may be reliably identified for further use. Alternatively, the reduction of silicon carbide (SiC) reliably produces small regions of graphitized carbon, but requires temperatures greater than 1000° C. (Berger, C.; Song, Z.; Li, T.; Li, X.; Ogbazghi, A. Y.; Feng, R.; Dai, Z.; Marchenkov, A. N.; Conrad, E. H.; First, P. N.; de Heer, W. A.; Ultrathin Epitaxial Graphite: 2D Electron Gas Properties and a Route toward Graphene-based Nanoelectronics. *J. of Phys. Chem. B* 2004, 108(52), 19912-19916; Berger, C.; Song, Z.; Li, X.; Wu, X.; Brown, N.; Naud, C.; Mayou, D.; Li, T.; Hass, J.; Marchenkov, A. N.; Conrad, E. H.; First, P. N.; de Heer, W. A.; Electronic confinement and coherence in patterned epitaxial graphene. *Science* 2006, 312(5777), 1191-1196).

While these methods have provided adequate samples for preliminary experimental results, both present a number of drawbacks and neither is well suited for industrial applications. First and foremost, the yield of single sheets produced is exceedingly low. Furthermore, the location of those specimens is largely random, and certainly not controllable to the level required for mass fabrication techniques. Finally, neither the peeling method nor the reduction of silicon carbide is scalable or high-throughput. These necessary conditions for the ultimate goal of graphene electronics present formidable hurdles and will continue to motivate research.

Chemists have recently proposed a third synthetic route through the oxidation and exfoliation of HOPG, which may provide a number of advantages (Viculis, L. M.; Mack, J. J.; Kaner, R. B.; A Chemical route to carbon nanoscrolls. *Science* 2003, 299(5611), 1361; Shioyama, H.; Akita, T.; A new route to carbon nanotubes. *Carbon* 2003, 41(1), 179-181; Stankovich, S.; Piner, R. D.; Nguyen, S. T.; Ruoff, R. S.; Synthesis and exfoliation of isocyanate-treated graphene oxide nanoplatelets. *Carbon* 2006, 44, 1558-1565; Stankovich, S.; Dikin, D. A.; Piner, R. D.; Kohlhaas, K. A.; Kleinhammes, A.; Jia, Y.; Wu, Y.; Nguyen, S. T.; Ruoff, R. S.; Synthesis of graphene-based nanosheets via chemical reduction of exfoliated graphite oxide *Carbon.* 2007, 45, 1558-1565; Gomez-Navarro, C.; Weitz, R. T., Bittner, A. M.; Scolari, M.; Mews, A.; Burghrd, M.; Kern, K. Electronic transport properties of individual chemically reduced graphene Oxide Sheets *Nano lett.* 2007, 7, 3499-3503). The resulting single sheets of oxidized graphite are stable as uniform aqueous dispersions. Although graphite oxide is itself an insulator, the sheets may be restored to semi-metallic graphene, and its planar structure, by chemical reduction or by thermal annealing. The technique has led to a number of functioning single sheet field-effect devices (Gilje, S.; Han, S.; Wang, M. S.; Wang, K. L.; Kaner, R. B.; A chemical route to graphene for device applications. *Nano lett.* 2007, 7, 3394-3398; Gomez-Navarro, C., Weitz R., Bittner, A. M., Scolari, M., Mews A., Burghard, M, and Kern, K. Electronic Transport Properties of Individual Chemically Reduced Graphene Oxide Sheets *Nano lett.* 2007, 7, 3499-3503). Fabrication typically includes air-brushing or spin-coating from water, followed by an electron-beam process to deposit electrodes, and in situ chemical reduction. Although graphite oxide dispersions facilitate some solution processing, the location of single sheets has been uncontrollable and individual sheets often aggregate due to the high surface tension of water (Stankovich, S.; Piner, R. D.; Nguyen, S. T.; Ruoff, R. S.;

Synthesis and exfoliation of isocyanate-treated graphene oxide nanoplatelets. *Carbon* 2006, 44, 1558-1565). In addition, many of the resulting sheets are found to be wrinkled or folded when examined by atomic force microscopy (AFM). Also, cross-sectional step heights of more than 1 nm are often observed for a single sheet which is much larger than the theoretical value of 0.34 nm found in graphite. This increased thickness may be attributed to unreduced surface hydroxyl and epoxide groups. Such functionalities are detrimental to the electrical properties of graphene. Furthermore, aqueous dispersions are not ideal for deposition as the high surface tension of water leads to aggregation during the evaporation process. Finally, even if GO is perfectly deposited, reduction methods tend to neglect the area in direct contact with the substrate. Attempts have been made to complete the reduction stage in solution, but sheets tend to aggregate due to the attractive forces between layers and an overall decrease in hydrophilicity. Therefore, there remains a need for improved methods of producing graphene as well as device made using graphene.

SUMMARY

A method of producing carbon macro-molecular structures according to some embodiments of the current invention includes dissolving a graphitic material in a solvent to provide a suspension of carbon-based macro-molecular structures in the solvent, and obtaining a plurality of the carbon macro-molecular structures from the suspension. The plurality of carbon macro-molecular structures obtained from the suspension each consists essentially of carbon. A material according to some embodiments of the current invention is produced according to the method of producing carbon macro-molecular structures. An electrical, electronic or electro-optic device includes material produced according to the methods of the current invention. A composite material according to some embodiments of the current invention has carbon macro-molecular structures produced according to methods of producing carbon macro-molecular structures according to some embodiments of the current invention. A hydrogen storage device according to some embodiments of the current invention has carbon macro-molecular structures produced according to methods of producing carbon macro-molecular structures according to some embodiments of the current invention. An electrode according to some embodiments of the current invention has carbon macro-molecular structures produced according to methods of producing carbon macro-molecular structures according to some embodiments of the current invention.

An electrode for an electrical, electronic or electro-optic device according to some embodiments of the current invention has a plurality substantially planar carbon macro-molecular structures, and a plurality of carbon nanotubes which are in electrical connection with at least two of the plurality of substantially planar carbon macro-molecular structures. The plurality of carbon nanotubes provide electrical connection between otherwise electrically isolated substantially planar carbon macro-molecular structures.

An electrical, electronic or electro-optic device according to some embodiments of the current invention has an electrode that has a plurality substantially planar carbon macro-molecular structures, and a plurality of carbon nanotubes which are in electrical connection with at least two of the plurality of substantially planar carbon macro-molecular structures. The plurality of carbon nanotubes provide electrical connection between otherwise electrically isolated substantially planar carbon macro-molecular structures.

A method of producing a device having patterned electrically conducting regions according to some embodiments of the current invention includes producing carbon macro-molecular structures, depositing the carbon macro-molecular structures on a first surface, providing a stamp having a pattern corresponding to a preselected pattern of electrically conducting regions of the device being produced, bringing the pattern of the stamp into contact with at least some of the carbon macro-molecular structures deposited on the first surface, and lifting the stamp from the first surface and bringing the pattern of the stamp into contact with a second surface to thereby transfer a pattern of electrically conducting regions of the carbon macro-molecular structures to the second surface. The producing of the carbon macro-molecular structures includes dissolving graphite oxide in a solvent to provide a suspension of carbon-based macro-molecular structures in the solvent, and obtaining a plurality of the carbon macro-molecular structures from the suspension, wherein the plurality of carbon macro-molecular structures obtained from the suspension consist essentially of carbon.

BRIEF DESCRIPTION OF THE DRAWINGS

Further objectives and advantages will become apparent from a consideration of the description, drawings, and examples.

FIGS. 3a-3d are results for an example graphene films according to an embodiment of the current invention. FIG. 3a is an optical image of an evenly and continuously distributed graphene film under 500× magnification. FIG. 3b is an AFM and FIG. 3c is an SEM image of the same large single sheet of graphene. FIG. 3d is a single cross-section (top) that indicates step heights of less than 0.6 nm as the AFM tip traverses the solid line in FIG. 3b. A histogram (bottom of FIG. 3d) of height profiles collected over the entire area of the image confirms the average step height of under 0.6 nm.

FIG. 4a is a schematic illustration of a graphene field effect device. FIG. 4b is a photograph, optical image, and SEM of a working device with a channel length of 7 µm according to an embodiment of the current invention.

FIG. 7a shows a representative SEM image of G-CNT film. FIG. 7b shows photographs of 1 mg of graphite oxide (GO) paper and 5 mg SWCNT dissolved in pure hydrazine (right) and in dichlorobenzene (DCB) (left), respectively. After 1 hr, G-CNT in DCB already precipitates out.

FIG. 8 shows representative SEM and AFM images of G-CNT film, along with 3-D topographies of (FIG. 8a) Chemically converted graphene.

FIG. 10 shows representative SEM images of a variety patterns of G-CNT electrode and device structure along with current density-voltage (J-V) curves. FIG. 10a shows SEM images of G-CNT patterns spin-coated on Si/SiO$_2$ substrates. FIG. 10b shows a device configuration of G-CNT based organic solar cell, consisting of G-CNT (5 nm)/PEDOT (25 nm)/P3HT:PCBM (230 nm)/Ca:Al (80 nm) according to an embodiment of the current invention. FIG. 10c shows current density vs. voltage (J-V) curves in the dark (upper, circles) and under simulated AM1.5G irradiation (100 mW cm$^{-2}$) using a xenon-lamp-based solar simulator (lower, squares).

FIG. 12 is an illustration of a method of producing graphene and/or G-CNT conducting patterns for device applications according to an embodiment of the current invention. A diagram (left) and optical microscope images (right) depict the PDMS transfer process according to an embodiment of the current invention. It begins by (FIG. 12a) depositing materials on a glass substrate and (FIG. 12b) carefully "inking" the pre-patterned PDMS stamp.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited herein are incorporated by reference as if each had been individually incorporated.

Figure 1:
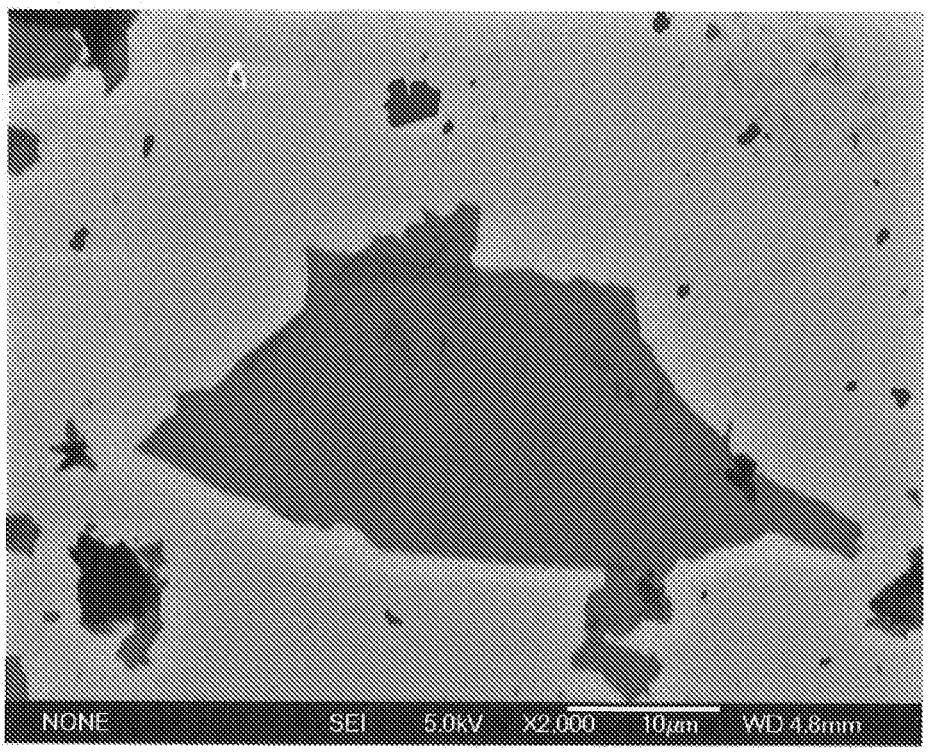
FIG. 1 is an SEM image of a large single graphene sheet (scale bar=10 µm).

According to some embodiments of the current invention we present a fundamentally new approach for producing large-scale single layer and few layer graphene (FIG. 1) through a scalable solution process. According to an embodiment of the current invention, graphite oxide (GO) paper is dispersed in substantially pure hydrazine to create stable dispersions of hydrazinium graphene (HG) through the formation of counterions. However, the broad concepts of the current invention are not limited to only GO paper. More generally, one can disperse a graphitic material in hydrazine, GO paper being just one possible example of a graphitic material. These hydrazine colloids are readily deposited onto a variety of substrates, producing uniform films of single and/or few layer graphene. Graphene is an example of a carbon macro-molecular structure according to some embodiments of the current invention. A few-layer graphene structure may have less than ten layers of carbon molecular structures according to some embodiments of the current invention. A few-layer graphene structure may have less than three layers of carbon molecular structures according to some embodiments of the current invention. In some embodiments of the current invention, graphene structures may be single substantially planar layers consisting essentially of carbon.

Figures 2A, 2B:
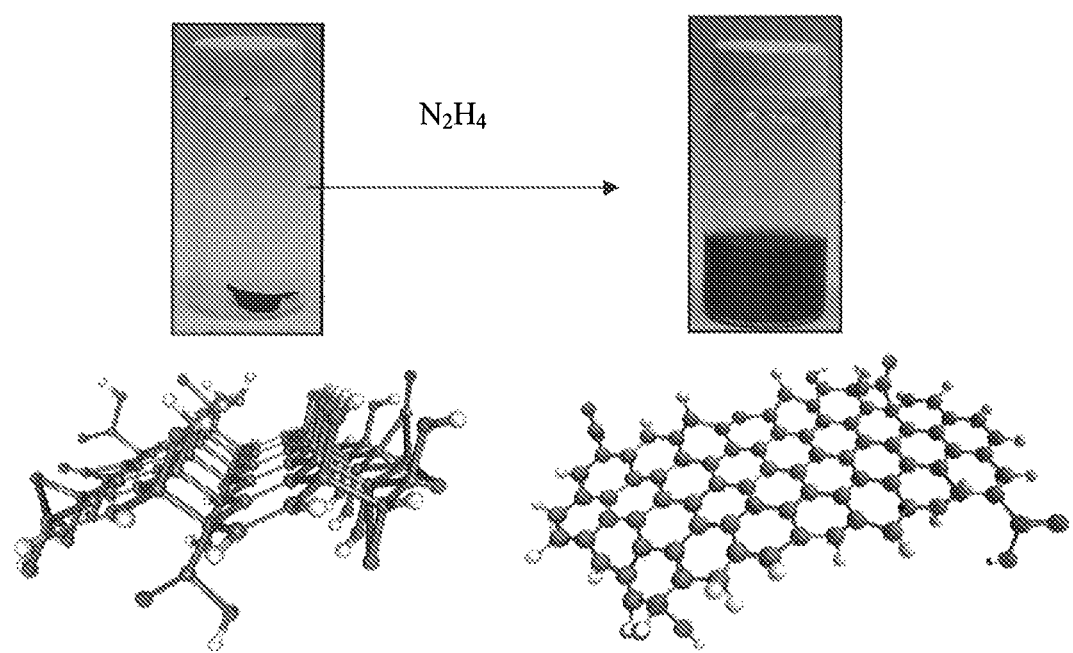
FIGS. 2a and 2b illustrate the preparation of graphene suspensions in an example according to an embodiment of the current invention. The photographs show (FIG. 2a) 10 mg of graphite oxide (GO) paper in a glass vial and (FIG. 2b) the resultant hydrazinium graphene (HG) dispersion after addition of hydrazine. Below each vial is a 3-D molecular model of GO and graphene, respectively, suggesting that removal of —OH and —COOH functionalities upon reduction restores a sheet structure.

Photographs of GO paper and HG are presented in FIGS. 2a and 2b, respectively, along with 3-D molecular models of GO before and after reduction. By controlling the concentration and composition of these dispersions, films of a desired morphology and surface coverage may be produced. This non-destructive method preserves the scalability of graphite oxide, ultimately forming reduced sheets much larger than those previously reported (Stankovich, S.; Piner, R. D.;

Nguyen, S. T.; Ruoff, R. S.; *Carbon* 2006, 44, 1558-1565; Stankovich, S.; Dikin, D. A.; Piner, R. D.; Kohlhaas, K. A.; Kleinhammes, A.; Jia, Y.; Wu, Y.; Nguyen, S. T.; Ruoff, R. S.; *Carbon* 2007, 45, 1558-1565; Gilje S.; Han S.; Wang M. S.; Wang K. L.; Kaner R. B.; *Nano lett.* 2007, ASAP; Gomez-Navarro C.; Weitz R. T.; Bittner A. M.; Scolari M.; Mews A.; Burghrd M.; Kern K. *Nano lett.* 2007, ASAP). This increase in size vastly reduces the amount of effort necessary for electronic testing and renders characterization possible by a number of microscopic techniques. In fact, the scale of graphene produced allows one of the most comprehensive studies yet conducted on the characterization of graphene.

Graphite oxide (GO) dispersions can be produced via a modified Hummers' method from graphite powder (Hummers, W. S., Jr.; Offeman, R. E.; *J. Am. Chem. Soc.* 1958, 80, 1339). Typical dispersions are 2% w/v GO in water and may be diluted to various concentrations for use. Uniformity of a given dispersion can be ensured by heating to 60° C. with repeated ultrasonication. In order to form GO paper, aqueous samples can be subjected to vacuum filtration through a 0.22 micron alumina membrane. This filtration process requires approximately 24 hours after which the resultant films are left to dry under ambient conditions. Each dry, matte black GO film is then carefully peeled from its membrane.

While the reduction of GO by hydrazine vapors is well known (Stankovich, S.; Piner, R. D.; Nguyen, S. T.; Ruoff, R. S.; *Carbon* 2006, 44, 1558-1565; Gilje S.; Han S.; Wang M. S.; Wang K. L.; Kaner R. B.; *Nano lett.* 2007, ASAP; Stankovich, S.; Piner, R. D.; Chen, X.; Wu, N.; Nguyen, S. T.; Ruoff, R. S.; *J. of Mat. Chem.* 2006, 16(2), 55-158; Liu, P.; Gong, K.; *Carbon* 1999, 37, 706-707), here the GO films are dispersed directly into a 98% anhydrous hydrazine solution in a nitrogen filled dry box according to an embodiment of the current invention. Bubbles rapidly form along the film surface due to the reduction, likely producing $NO_2$ and $N_2$. After several hours, no GO solid can be observed in solution and bubbling subsides, indicating complete dispersion and reduction, respectively. As an explanation for the new dispersions created, we suggest the formation of hydrazinium graphene (HG) comprised of a negatively charged, reduced graphene sheet surrounded by $N_2H_4^+$ counterions. Hydrazinium compounds readily disperse in hydrazine (Bourlinos, A. B.; Gournis, D.; Petridis, D.; Szabo, T.; Szeri, A.; Dékány, I.; *Langmuir* 2003, 19(15), 6050-6055). The resultant dispersions are stable for months with little aggregation. Purification of HG solutions can be carried out with various combinations of ultrasonication, dilution and centrifugation, for example. Briefly, dispersions of large (20 μm×20 μm) single sheets can be created by pelleting higher density multilayers via centrifugation. Such dispersions can be very useful for electronic applications due to the ease of making contact at the length scales of these relatively large single sheets. Alternatively, large sheets and aggregates may be fractured into uniform dispersions of smaller single sheets (e.g. 1 μm×1 μm) by repeated ultrasonication. These small sheets readily make continuous films upon deposition and can be useful as "transparent" conductors. Note that even these smaller sheets are large when compared to those prepared by either the peeling method or by chemical reduction of SiC, which have typically been no more than 0.2 $μm^2$.

HG suspensions can be spin-coated onto $Si/SiO_2$ substrates, for example, for characterization. After deposition, the films can be thermally annealed at 150° C. in order to remove all hydrazine and to return the HG samples to pristine graphene. Note that HG may also be dried and re-suspended in the organic solvent DMSO for deposition (Bourlinos, A. B.; Gournis, D.; Petridis, D.; Szabo, T.; Szeri, A.; Dékány, I.; *Langmuir* 2003, 19(15), 6050-6055). This approach has the advantage of avoiding spin-coating from a solvent of hydrazine's toxicity.

The initial characterization of deposited samples is carried out by examination through an optical microscope, which was originally used to identify single layer graphene (Novoselov K. S.; Geim A. K.; Morozov S. V.; Jiang D.; Zhang Y.; Dubonos S. V.; Grigorieva I. V.; Firsov A. A.; *Science* 2004, 306 (5696), 666-9). Here, however, we use optical images primarily to observe the surface coverage of the depositions. For more detailed structural information, scanning electron microscope (SEM) images were collected, with a representative image of a large single sheet (~40×25 μm) shown in FIG. 1. SEM images were collected under a variety of accelerating voltages and probe currents in an attempt to improve contrast and resolution. Ultimately, a relatively small accelerating voltage (2-5 kV) and probe current (5-8 μA) proved most appropriate as they reduce the penetration depth of incident electrons and more directly probe surface species. With experience, single, double, triple and multilayer graphene may be differentiated by SEM.

Although SEM images can be used to find single sheets of graphene, the images are representative of electronic structure, not topography. Hence, atomic force microcopy (AFM) is needed to establish the thickness and surface roughness of single sheets. For comparison, a representative AFM height image and its corresponding SEM image are shown in FIGS. 3b and 3c, respectively. Height profiles show steps from $SiO_2$ to graphene of ~0.6 nm for a given cross-section (FIG. 3d). The histogram provided represents height data over the entire area of the scan, confirming the 0.6 nm step value. A similar analysis of samples prepared by the peeling method has been performed in ultra-high vacuum (UHV), and also shows typical step heights for single layer graphene of 0.6 nm (Mitzi B. D.; Copel M.; Chey S. J.; *Adv Mater.* 2005, 17, 1289-1293). The apparent 0.3 nm discrepancy in thickness as compared with theoretical values suggests the presence of some nitrogen, oxygen, or water adsorbed onto the sheets (Novoselov K. S.; Geim A. K.; Morozov S. V.; Jiang D.; Zhang Y.; Dubonos S. V.; Grigorieva I. V.; Firsov A. A.; *Science* 2004, 306 (5696), 666-9). Never-the-less, the agreement between peeled samples and those measured here provides significant evidence that the planar structure of graphene has been largely reestablished upon reduction. Although reduced GO samples have been studied by AFM before, the size limitations of single sheets have not previously permitted such quantitative comparisons.

In an investigation of graphene, the characterization of electrical properties and fabrication of electronic devices are of interest. Due to the size limitations of most graphene samples, e-beam lithography has been the only reliable method for producing patterns necessary for electrical testing. In a typical e-beam process, single sheet candidates are located by SEM, markers provided, and a polymethyl methacrylate photo-resist is selectively exposed. After removing the photo-resist, gold source and drain electrodes are then evaporated onto the surface to provide a top contact configuration for the graphene device. This method is laborious and requires a sophisticated lithographic setup, making it difficult to scale up. Moreover, this lithographic process can degrade device performance if the photo-resist is not entirely removed. Acrylic lithography resists have recently been reported to introduce unknown and unfavorable contamination (Schniepp C. H.; Li J. L.; McAllister J. M.; Sai h.; Herrera-Alonso M.; Adamson H. D.; Prud'homme K. R.; Car R.; Sacille A. D.; Aksay A. I. *J. Phys. Chem. B* 2006, 110, 8535-8539; Ishigami M.; Chen J. H.; Cullen W. G.; Fuhrer M.

Figure 4A:
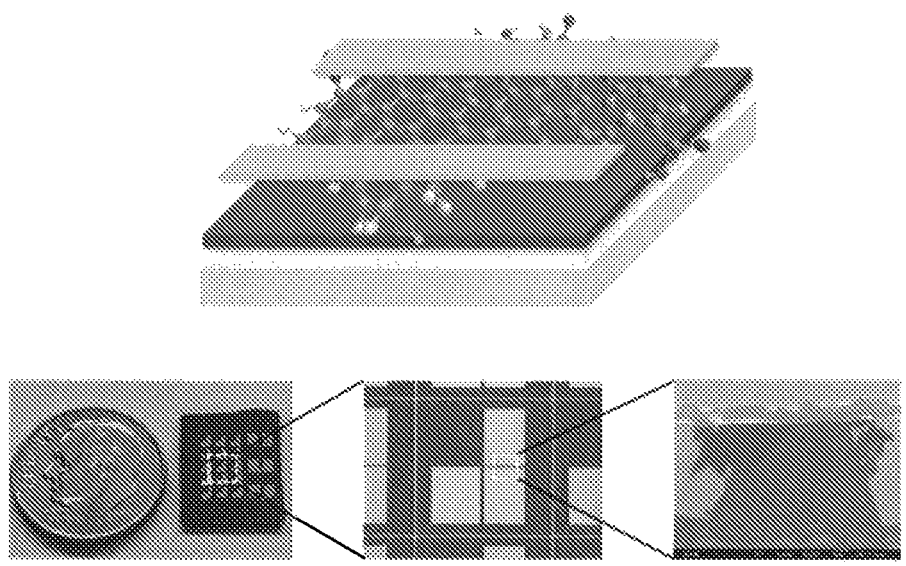
FIGS. 4a and 4b show an electronic device according to an embodiment of the current invention. Arrays of working graphene transistors were produced by spin-coating a well-dispersed graphene solution onto $SiO_2$ substrates, followed by registering gold source-drain electrodes on top of the single sheets.
Figure 4B:
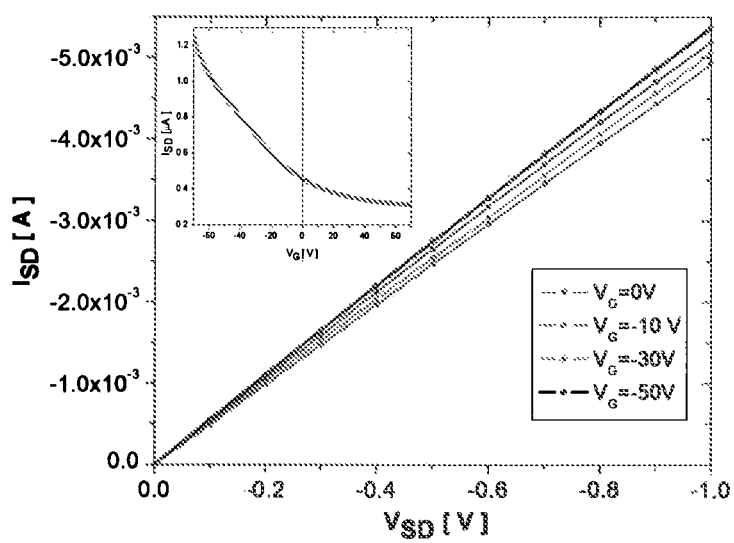

S.; Williams E. D.; *Nano Lett.* 2007, 7, 1643-1648). The size of the graphene sheets reported here, however, can provide far fewer constraints for the effective fabrication of devices. The large graphene sheets can instead be processed via conventional photolithography on silicon dioxide substrates to provide gold source-drain top contacts. FIG. 4a provides a schematic of a field effect transistor (FET) according to an embodiment of the current invention. FIG. 4b is a photograph, optical image, and SEM of an actual working device corresponding to FIG. 4a. Electrode separation channel lengths of 7 μm can be used and no alignment is necessary in order to reliably produce single sheet devices. This is due to the nearly uniform and tunable distribution of single sheets over a large area of the wafer (~1.5×1.5 cm).

Figure 5A:
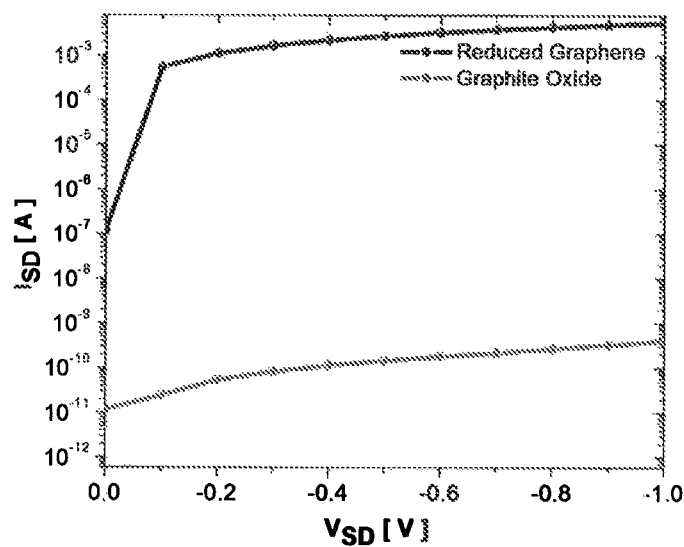
FIG. 5a shows Current ($I_{SD}$)—Voltage ($V_{SD}$) of reduced graphite oxide film devices according to an embodiment of the current invention. As the gate voltage is varied from 0 V to −50 V, the conductance of the device increases, indicative of a P-type semiconductor. The inset shows I-$V_G$ characteristic curve at $V_{SD}$=0.1 V.
Figure 5B:
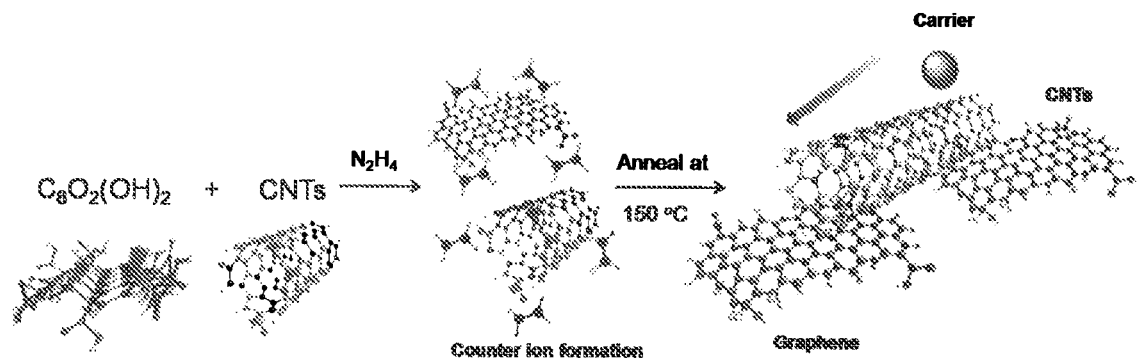
FIG. 5b shows that current ($I_{SD}$) —Voltage ($V_{SD}$) plots taken on graphite oxide films before and after reduction indicate a $10^8$ fold decrease in sheet resistance according to an embodiment of the current invention.

More than 50 devices were tested to confirm the electrical output performance with all measurements carried out under ambient conditions. P-type behavior is readily and reproducibly attained at gate voltages ranging from 0 to −60 V. FIG. 5a shows the output and transfer characteristics of a typical field effect device according to an embodiment of the current invention. Output $V_{SD}$-$I_{SD}$ curves show up to 6 mA at source-drain voltages of only −1 V. This represents a considerable improvement over previously reported values for reduced GO (25 μA at $V_{SD}$ equals to −5 V) (Gilje S.; Han S.; Wang M. S.; Wang K. L.; Kaner R. B.; *Nano lett.* 2007, ASAP) at considerably larger channel lengths (7 μm vs. 500 nm as previously reported). The results show current responses comparable to those of graphene produced by the peeling method (up to 100 μA at Vsd=10 mV and channel lengths of 0.5 μm) (Novoselov K. S.; Geim A. K.; Morozov S. V.; Jiang D.; Zhang Y.; Dubonos S. V.; Grigorieva I. V.; Firsov A. A.; *Science* 2004, 306 (5696), 666-9). FIG. 5b shows output curves for parent GO and our reduced graphene, indicating a $10^8$ fold decrease in sheet resistance. We attribute the increase in conductivity and mobility to more complete reduction of GO by anhydrous hydrazine. Graphene samples produced via the drawing method should be understood to represent the ultimate reduction limit of our devices. Several methods for the chemical modification of reduced samples to achieve n-type behavior of graphene according to some embodiments of the current invention have been devised. These include functionalization, e.g. alkylation, of parent GO materials before suspension in hydrazine.

The large size of the graphene sheets produced according to some embodiments of the current invention can enable RAMAN spectroscopy to be carried out on a working FET. This can provide a non-destructive method for characterizing graphene (Matthew J. A.; Tran. H.; Tung C. V.; unpublished; Ferrari A. C.; Meyer J. C.; Scardaci V.; Casiraghi C.; Lazzeri M.; Mauri F.; Piscanec S.; Jiang D.; Novoselov K. S.; Roth S.; Geim A. K.; *Phys. Rev. Lett.* 2006, 97, 187401-187404; Tuinstra F.; Koenig J. L.; *J. Chem. Phys.* 1970, 53, 1126-1130; Reich S.; Thomsen C.; *Phil. Trns. R. Soc. Lond.* A 2004, 362, 2271-2288; Gupta A.; Chen G.; Joshi P.; Tadigadapa S.; Eklund P. C.; *Nano Lett.* 2006, 6, 2667-2673; Graf D.; Molitor F.; Ensslin K.; Stampfer C.; Jungen A.; Hierold C.; Wirtz L.; *Nano Lett.* 2007, 7, 238-242; Calizo I.; Balandin A.; Bao W.; Miao F.; Lau C. N.; *Nano Lett.* ASAP). D (1350 $cm^{-1}$), G (1600 $cm^{-1}$), 2D (2700 $cm^{-1}$), and S3 (2950 $cm^{-1}$) graphitic peaks are present in the spectra of the reduced samples. An increase of the D/G ratio upon reduction of GO is observed, indicating an increase in the total number of graphitic regions present. Residual $sp^3$ carbons likely contribute to the prominence of the D peak and suggest some unreduced regions.

The chemically modified GO materials according to some embodiments of the current invention are the largest graphene samples produced to date and can be readily processed in a reliable, scalable method. This technique is extremely versatile and can be used to create a myriad of coatings and geometries necessary for device applications and a full range of characterization techniques. We believe that the large-scale of these single sheets represents a breakthrough in fabrication and could pave the way for new and innovative experiments on single layer graphene. In addition, the stability of the reduced dispersions can allow a new class of experiments and characterization to be performed in solution.

The processing described here, along with current techniques in micro-patterning, makes possible the fabrication of a wide variety of graphene-based devices according to some embodiments of the current invention. The scalable solution process according to some embodiments of the current invention can be suitable for electronic applications, such as field-effect devices, non-volatile memory modules, and the circuits thereof. Electro-chemical applications can include use of graphene as large surface area carbon in (zinc-carbon) batteries, for example. Large area depositions may be immediately implemented as semi-transparent electrodes or anti-static coatings, for example. Graphene suspensions may be combined with a variety of structural polymers, producing composite materials that benefit from enhanced strength and improved electrical properties. Such composites can be especially appropriate for military applications as radar absorbent materials (RAMs), for example. Graphene's sensitivity to chemical environments lends itself naturally to applications in sensors, which could be mass-produced via this solution process. Particularly attractive may biological applications, such as a graphene based, in-situ glucose sensor, for example.

Graphene-Carbon Nanotube Hybrid Transparent Conductors

Printed transparent conductors using solution-based techniques for patterning and deposition are of great interest as they represent low cost, and high throughput alternatives to conventional thermal evaporation or sputtering. Nevertheless, conventional approaches have several drawbacks. First and foremost, synthesis of such materials typically involves multiple low yield steps. Second, the electrical conductivity is poor, as is chemical and thermal stability. Currently, indium tin oxide (ITO) represents the industry standard for transparent conductors, capable of delivering a sheet resistance of ~40Ω/□ at 85-90% transmittance. However, several key issues will likely exclude ITO from meeting future challenges. First, the world's production of indium is limited, with recent increases in demand, especially for LCD manufacturing, resulting in a price increase of over ten-fold in just the past five years. The future demand for indium by the solar power industry at grid parity could be tremendous in scale and could readily overwhelm the supply. Second, ITO deposition is an expensive process to scale up because it includes sputtering directly under vacuum conditions. Third, ITO's physical properties are less than ideal, as it is a relatively brittle material and incompatible with the flexible substrates used in most roll-to-roll processes. According to some embodiments of the current invention we provide a facile synthesis of a surfactant free, nano-scale composite comprised of graphene and carbon nanotubes. Methods of production according to this embodiment of the current invention can be high throughput and without suffering the shortcomings of ITO. A feature of this embodiment of the current invention is the use of a single phase synthesis to reduce and disperse a homogenous solution of both chemically converted graphene (CCG) and carbon nanotubes (CNTs).

Since their creation in bulk form in 1991, CNTs have delivered high axial carrier mobilities in small-scale devices, making them an obvious choice for use as transparent conductors. High aspect ratios lead to low percolation thresholds, meaning very little material is needed for conduction (Hu, L., Hecht, D. S. & Gruner, G. Percolation in transparent and conducting carbon nanotube networks. *Nano Lett.* 4, 2513-2517 (2004)). Thus far, CNTs are capable of delivering resistivities around 500Ω/□ at 80~85% transmittance (Hu, L., Hecht, D. S. & Gruner, G. Percolation in transparent and conducting carbon nanotube networks. *Nano Lett.* 4, 2513-2517 (2004); Wu, Z. et al. Transparent conductive carbon nanotube film. *Science*, 305, 1273-1277 (2004); Hu, L., Gruner, G., Li, D., Kaner, R. B. & Cech, J. Patternable transparent carbon nanotube films for electrochromic devices. *Journal of Applied Physics*, 101, 016102-016104 (2007); Li, J., Hu, L., Wang, L., Zhou, Y., Gruner, G. & Marks, T. J. Organic light-emitting diodes having carbon nanotube anodes. *Nano Lett.* 6, 2472-2477 (2006); Zhang, D. et al. Transparent, conductive, and flexible carbon nanotube films and their application in organic light-emitting diodes. *Nano Lett.* 6, 1880-1886 (2006); Ago, H., Petritsch, K., Shaffer, M. S. P., Windle, A. H. & Friend. R. H. Composites of carbon nanotubes and conjugated polymers for photovoltaic devices. *Adv. Mater.* 11, 1281-1286 (1999); Rowell, M. W. et al. Organic solar cells with carbon nanotube network electrodes. *Applied Phys. Lett.* 88, 233506-233509 (2006); Pasquier, A. D., Unalan, H. E., Kanwal, A., Miller, S. & Chhowalla, M. Conducting and transparent single-wall carbon nanotube electrodes for polymer-fullerene solar cells. *Applied. Phys. Lett.* 87, 203511-203513 (2005)).

Graphene, a single layer of carbon, has been touted for its potential as an excellent electrical conductor since its experimental discovery in 2004 (Novoselov, K. S. et al. Electric field effect in atomically thin carbon films. *Science*, 306, 666-669 (2004); Gusynin V. P. & Sharapov S. G. Unconventional integer quantum Hall effect in graphene. *Phys. Rev. Lett.* 95, 146801-146804 (2005); Zhang, Y., Tan, Y. W., Stormer, H. L. & Kim, P. Experimental observation of the quantum Hall effect and Berry's phase in graphene. *Nature* 438, 201-204 (2005); Novoselov, K. S. et al. Unconventional quantum Hall effect and Berry's phase of 2pi in bilayer graphene. *Nature Physics* 2, 177-180 (2006); Novoselov, K. S. et al. Room-temperature quantum Hall effect in graphene. *Science* 315, 1379 (2007)). Graphene can be conceptually viewed as a CNT cut along its axis and unrolled to lay flat. It can provide conduction pathways to a greater area per unit mass than CNTs, which should translate into improved conductivity at lower optical densities. The challenge has been in scaling up the mechanical cleavage of graphite. Single layer samples are most often the result of a laborious peeling method, which is neither scalable nor capable of producing uniform depositions Watcharotone, S. et al. Graphene-Silica composite thin films as transparent conductors. *Nano Lett.* 7, 1888-1892 (2007)). Recently, researchers have circumvented the problem of mechanical cleavage by using graphite oxide (GO), a layered compound that can be readily dispersed as individual sheets in a good solvent (I. Jung, D. A. Dikin, R. D. Piner, R. S. Ruoff, *Nano Lett.* 2008, DOI: 10.1021/n18019938.; Stankovich, S. et al. Synthesis of graphene-based nanosheets via chemical reduction of exfoliated graphite oxide. *Carbon* 45, 1558-1565 (2007); Hummers, W. S. & Offeman, R. E. Preparation of graphitic oxide. *J. Am. Chem. Soc.* 80, 1339 (1958); Gilje, S., Han, S., Wang, M. S., Wang, K. L. & Kaner, R. B. A chemical route to graphene for device applications. *Nano lett.* 7, 3394-3398 (2007); Gomez-Navarro, C. et al. Electronic transport properties of individual chemically reduced graphene Oxide Sheets. *Nano lett.* 7, 3499-3503 (2007); Li, X., Wang, X., Zhang, L., Lee, S. & Dai, H. Chemically derived, ultrasmooth graphene nanoribbon semiconductors. *Science*, 319, 1229-1232 (2008); Tung, V. C., Allen, M. J., Yang, Y. & Kaner, R. B. High throughput solution processing of large scale graphene. *Nature Nanotech.* doi:10.1038/nnano.2008.329; Li, D., Mueller, M. B., Gilje, S., Kaner, R. B. & Wallace, G. G. Processable aqueous dispersion of graphene nanosheets. *Nature Nanotech.* 3, 101-106 (2008); Hernandez, Y. et al. High-yield production of graphene by liquid-phase exfoliation of graphite. *Nature Nanotech.* 3, 563-568 (2008)). Although GO itself is not electrically conductive, the conjugated network may be restored upon reduction in hydrazine vapor or with high heat after deposition. However, both reduction methods have their drawbacks, as high temperatures are incompatible with flexible substrates (e.g. polyethylene terephthalate—PET) and hydrazine vapors are only able to access and reduce the outer surface of deposited films. Other reduction methods, such as $NaBH_4$, phenyl hydrazine, and KOH in aqueous solution, have been suggested. However, incomplete reduction or large aggregates are often observed. Hence, the resulting graphitic regions are limited, which is detrimental to carrier transport and conductivity. Films of vapor phase reduced GO were reported recently and displayed poor conductivity i.e. $10^4$-$10^5$Ω/□ at 80% transmittance (Li, X. et al. Highly conducting graphene sheets and Langmuir-Blodgett films. *Nature Nanotech.* 3, 538-542 (2008); Wang, X., Zhi, L. & Mullen, K. Transparent, conductive graphene electrodes for dye-sensitized solar cell. *Nano Lett.* 8, 323-327 (2008); Wang, X. et al. Transparent carbon films as electrodes in organic solar cells. *Angew. Chem. Int. Ed.* 47, 1-4 (2008); Eda, G., Fanchini, G. & Chhowalla, M. Large-area ultrathin films of reduced graphene oxide as a transparent and flexible electronic matrial. *Nature Nanotech.* 3, 270-274 (2008); Becerril, H. et al. Evaluation of solution-processed reduced graphene oxide films as transparent conductors. *ACS Nano* 2, 463-470 (2008); Wu, J. et al. Organic solar cells with solution-processed graphene transparent electrodes. *Applied Phys. Lett.* 92, 263302-263304 (2008)).

Attempts to combine CNTs and CCG in a single layer have also been reported, but the resulting films were too thick for optical applications (Cai, D., Song, M. & Xu, C. Highly conductive carbon-nanotube/graphite oxide hybrid films. *Adv. Mater.* 20, 1706-1709 (2008); Yu, A. et al. Enhanced thermal conductivity in a hybrid graphite nanoplatelet-carbon nanotube filler for epoxy composites. Adv Mat, DOI: 10.1002/adma.200800401). By combining CNTs and CCG in a single layer, the conductivity compared to CNTs films can be enhanced, while sacrificing little in transparency, according to some embodiments of the current invention. Our approach according to some embodiments of the current invention uses hydrazine to disperse and reduce graphite oxide enabling the deposition of uniform films on almost any substrate by spin-coating, as described above. This method can produce more complete restoration of the graphitic network as compared to the analogous vapor phase process, which translates into more highly conductive films. Adding CNTs to our hydrazine suspensions of CCG now enables the deposition of thin and uniform layers of the hybrid material.

Figures 6, 7A, 7B:
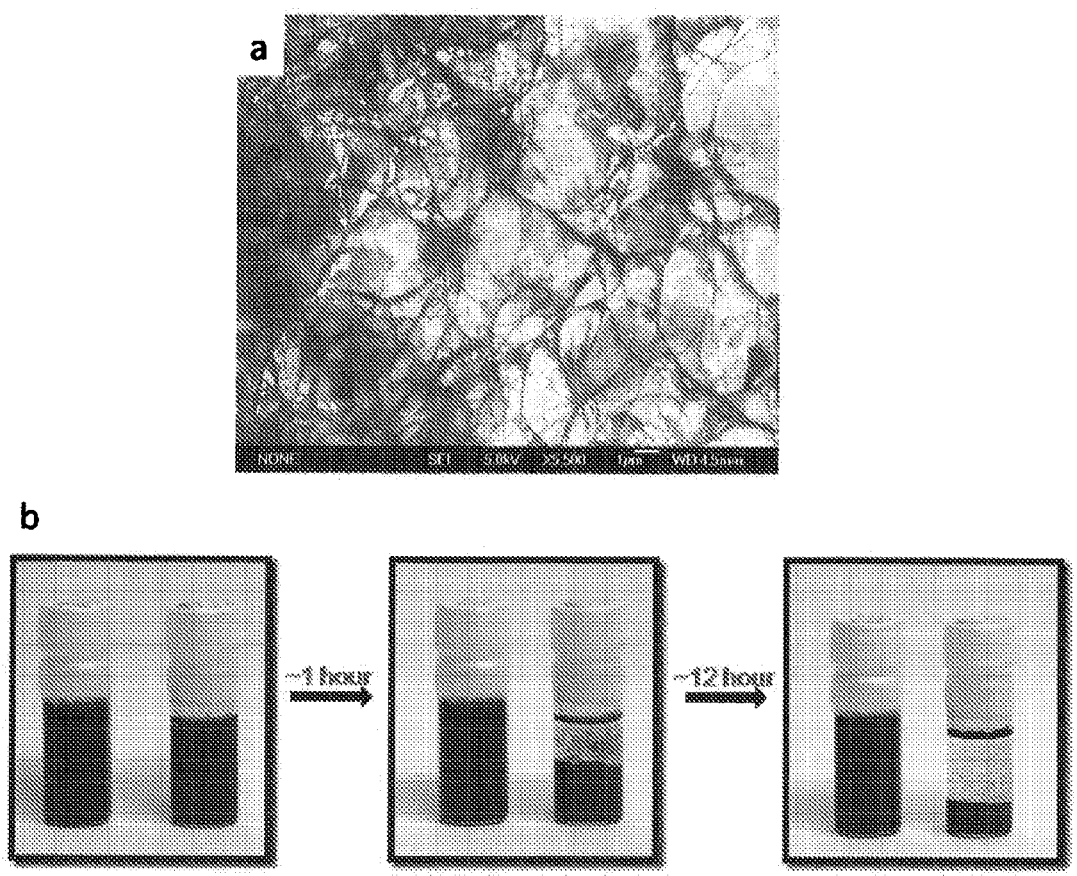
FIG. 6 is a schematic illustration of a method of producing carbon macro-molecular structures according to an embodiment of the current invention.
FIGS. 7a and 7b illustrate the preparation of chemically converted graphene-CNT suspensions according to an embodiment of the current invention.

To this end, graphite oxide was first synthesized and purified using Hummers method (see above). The resulting dry graphite oxide powders were dissolved in DI water with the assistance of ultrasonication. The stable dispersion was filtered through an alumina membrane and left to dry for several days. Once dried, the graphite oxide paper was carefully peeled from the filter and stored under ambient conditions. In order to enhance the solubility, CNTs were refluxed in a mixture of nitric acid and sulfuric acid to activate the surface with oxygen functionalities. As a result, most of the CNTs are terminated with hydroxyl and carboxylic moieties. After refluxing for 24 hrs, the resulting black dispersion was filtered and washed repeatedly with a combination of DI water and ethanol as shown in FIG. 6. To produce hybrid suspensions of CCG and CNTs (referred to also as G-CNT), dry powders of GO and slightly oxidized CNTs were dispersed directly in anhydrous hydrazine and allowed to stir for 1 day. Hydrazine bubbles violently upon contact with the carbon powders, but soon forms a uniform dark-gray suspension with no visible solids remaining. A range of compositions were achieved following this protocol, with GO and CNT concentrations observed up to at least 1 mg/mL. A post-treatment process combining ultra-sonication and centrifugation can be used to vary the composition of the dispersions before deposition.

To our knowledge this is the first report of dispersing CNTs in anhydrous hydrazine. This is an important observation as it provides a route to deposition that does not involve the use of surfactants, which typically degrade electrical performance. For the stable dispersion of CNTs in hydrazine, we suggest the formation of hydrazinium compounds comprised of negatively charged CNTs surrounded by $N_2H_4^+$ counter-ions. Such hydrazinium compounds are known to readily disperse in hydrazine (Mitzi, B. D., Copel, M. & Chey, S. J. Low-voltage transistor employing a high-mobility spin-coated chalcogenide semiconductor. *Adv Mater.* 17, 1289-1293 (2005)). The mechanism for hydrazine reduction of the CNTs is not entirely understood, but is consistent with our observations of gas evolution upon contact. Unlike CNTs suspensions in organic solvents, CNTs and G-CNT dispersions in hydrazine are stable for months with little aggregation as shown in FIG. 7b. Moreover, UV/Vis spectra were carried out to characterize the dispersions. Solutions prepared using 1 mg graphene, 10 mg CNTs and a combination of the two were directly dispersed into anhydrous hydrazine. Prior to characterization, ultra-sonication was used to ensure a stable dispersion. Typically, CNTs exhibit a $C_m^1$ to $V_m^1$ absorption band at 650 nm within the van Hove singularities, whereas graphene displays a broad absorption band (Li, D., Mueller, M. B., Gilje, S., Kaner, R. B. & Wallace, G. G. Processable aqueous dispersion of graphene nanosheets. *Nature Nanotech.* 3, 101-106 (2008); Holzinger, M. et al. Fictionalization of single-walled carbon nanotubes with (R-) oxycarbonyl nitrenes. *J. Am. Chem. Soc.* 124, 8566-8580 (2003)). The spectra suggest that the electronic structures of both graphitic materials have been largely preserved due to the presence of the characteristic absorption bands. Note that the formation of covalent bonding could be detrimental to the intrinsic electronic conductivity. Nonetheless, the G-CNT composites showed red shifts in their absorbance spectra. The shift of the absorbance band can be attributed to strong $\pi$-$\pi$ interactions between graphene and CNTs. If one wishes to avoid spin-coating from a solvent of hydrazine's toxicity, the hydrazinium complexes can also be dried and re-suspended in DMSO, DMF and THF before deposition (Tung, V. C., Allen, M. J., Yang, Y. & Kaner, R. B. High throughput solution processing of large scale graphene. *Nature Nanotech. doi:*10.1038/nnano.2008.329).

G-CNT dispersions were readily deposited onto a variety of substrates by spin-coating and subsequently heated to 150° C. to remove excess solvent. Note that the modest temperature of this post-treatment is fully compatible with flexible substrates, especially in contrast to previously explored procedures used for GO electrodes. The present synthesis is facile and can provide the following advantages according to some embodiments of the current invention: (i) one phase reaction without additional surfactants, (ii) the homogeneity and composition of films is simply determined by composition of the parent suspension, spin-coating parameters (speed and duration), and surface modification of the substrate, (iii) relatively inexpensive starting materials, and (iv) high throughput patterning over large area.

The initial characterization of depositions was carried out by examination with a scanning electron microscope (SEM). FIG. 7a provides an SEM image of one such deposited film according to an embodiment of the current invention. These images are used primarily to determine structural information for hybrid films, and to understand the effects of different coating conditions. We explored a myriad of spin speeds and durations as well as surface modification of substrates via an $O_2$ plasma treatment. The image presented shows the percolating network of intertwined graphene and CNTs common to most films according to this embodiment of the current invention. Good contrast in SEM can be difficult to obtain, with relatively low accelerating voltages (1.5-3.0 kV) and probe currents (5-8 µA) delivering the best results on 300 nm $Si/SiO_2$ substrates.

Figures 8A, 8B:
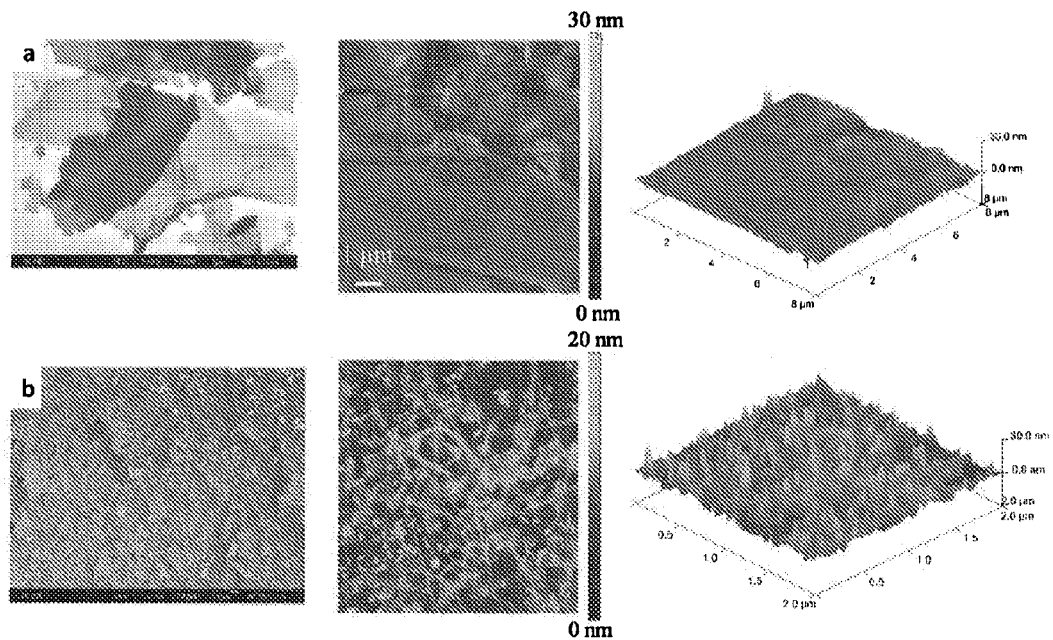
(FIG. 8b) Single wall carbon nanotubes network.
Figures 8C, 8D:
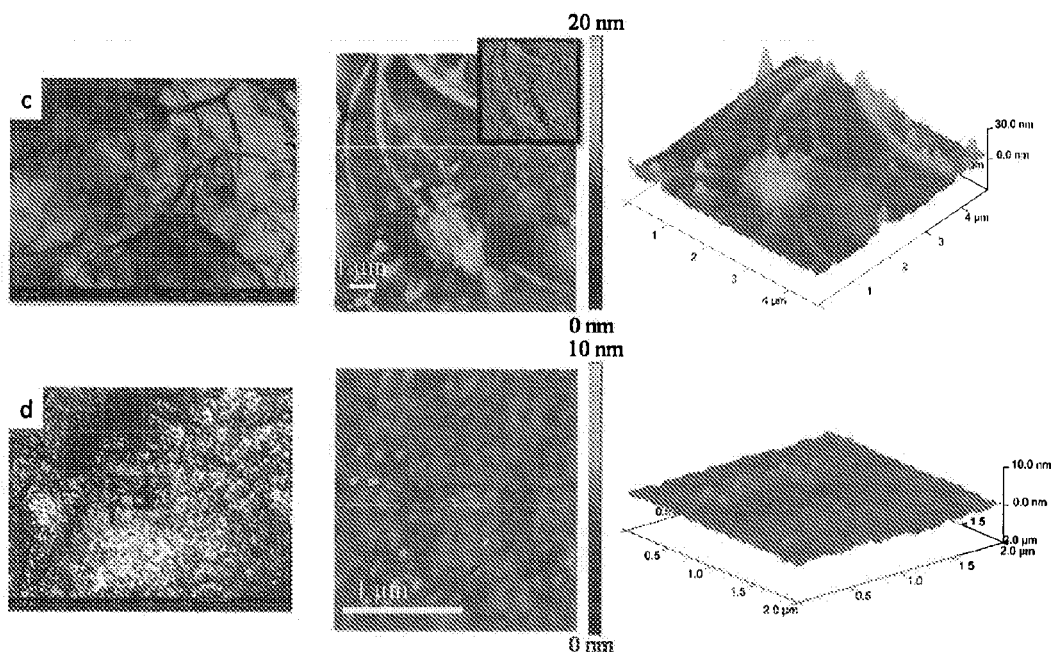
(FIG. 8c) G-CNT hybrid film. Note that the dense network of G-CNT film exceeds the percolation threshold with average surface roughness of 5~10 nm. Inset: phase diagram juxtapose the large sheet of chemically converted graphene and individual SWCNT.
(FIG. 8d) G-CNT film after surface optimization. Height profile (dark curve) taken along the white solid line shows the average surface roughness of 1.49 nm.

Although SEM images can be used to understand generally the morphology of the films, they are not accurate representations of topography. Hence, we employed atomic force microscopy (AFM) to establish the thickness and surface roughness of the depositions. FIG. 8 shows representative AFM images for single component films, (a) CNTs and (b) graphene, as well as for the (c) hybrid. The hybrid film is approximately 5 nm thick, and exhibits a rough surface covered with CNT bundles/ropes. These bundles are problematic for device fabrication as they often protrude up through the active layers and cause shorting. In order to improve this roughness, G-CNT dispersions were sonicated for 90 minutes prior to deposition. This treatment was sufficient to break up the CNT bundles and remove the troublesome protrusions, reducing the r.m.s. surface roughness to ~1.9 nm as shown in FIG. 8d.

Figure 9A:
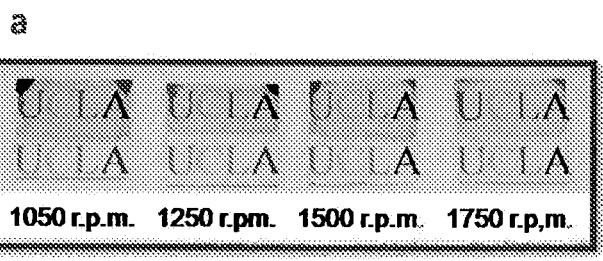
FIG. 9a shows photographs of G-CNT film with increasing spin speed (from left to right), 1,050, 1,250, 1,500, 1,750 RPM, respectively.
Figure 9B:
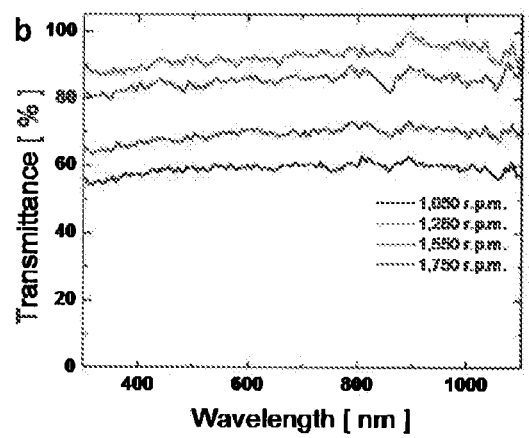
FIG. 9b shows optical transmittance of G-CNT films as a function of different spin speed.
Figure 9C:
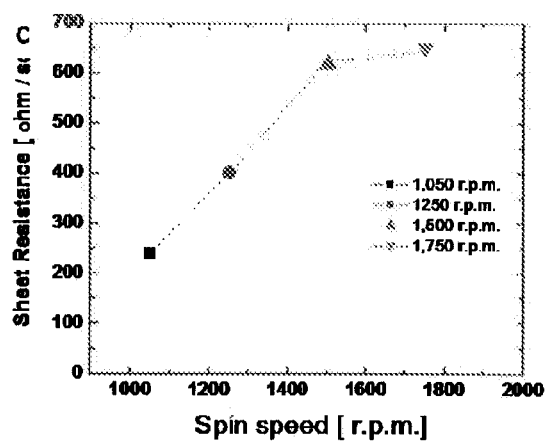
FIG. 9c shows sheet resistance versus different spin speed. Electrical measurements of G-CNT films before (left) and after (right) bending. I-V characteristics of ITO and G-CNT electrode on PET before (FIG. 9d) and after (FIG. 9e) bending at 60 degrees for 10 times. The ITO resistance increases three orders of magnitudes, while G-CNT hybrid electrode remains exceedingly low resistance.

Once we achieved the desired surface roughness, G-CNT films were deposited on glass substrates and further characterized by UV/Visible spectroscopy at normal incidence. Spin-speed had the most direct effect on transmittance, as evident in the photographs and spectra presented in FIG. 9. As expected, higher spin-speeds delivered thinner films that were more optically transparent, with those deposited at 1,050, 1,250, 1,500 and 1,750 RPMs displaying optical transmittances of 58, 70, 87, and 92%, respectively. Note that compared with electrodes comprised of graphene only, the addition of CNTs does not appear to significantly increase the overall absorbance. Four-point sheet resistance measurements were made on the same devices after deposition of small gold fingers. FIG. 9c shows the relationship between spin-speed and sheet resistance. Again the observed relationship is consistent with expectations, with higher spin-speeds delivering less material and hence fewer conduction pathways. As shown in the figures, the film deposited at 1,750 RPMs showed optical transmittance of 92% and a sheet resistance of only 636Ω/□. This sheet resistance is nearly 4 orders of magnitude lower than the analogous vapor reduced GO films reported previously (~1 M Ω/□ and 80~85% transmittance). Control experiments were also performed on single component CNTs and graphene films deposited from hydrazine, which reveal sheet resistances of 22 kΩ/□ and 980 kΩ/□, respectively. To explain the vast improvement in sheet resistance, we suggest the formation of an extended conjugated network with individual CNTs bridging the gaps between graphene sheets. The large graphene sheets cover the majority of the total surface area, while the CNTs act as wires connecting the large pads together.

Figure 9D:
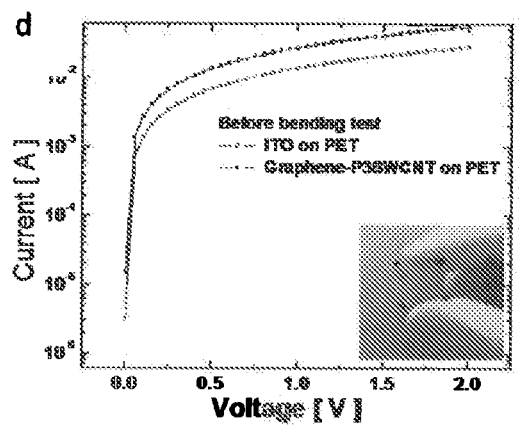
FIG. 9 shows optical, electrical and mechanical characterization of G-CNT films according to an embodiment of the current invention.
Figure 9E:
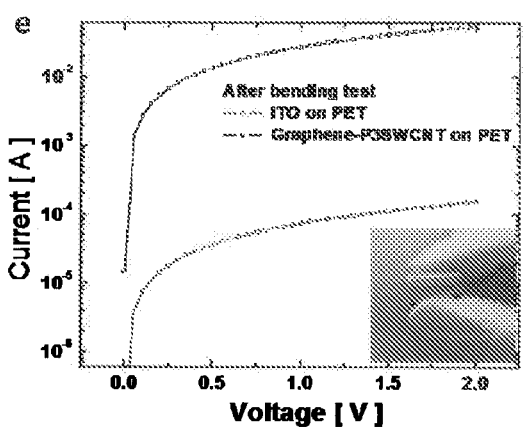

CNTs electrodes consistently outperform ITO on flexible substrates. The nanoscale architecture of intertwined CNTs is not significantly affected by bending on the macro-scale because the radius of curvature is so much larger than a single tube. In contrast, ITO's rigid inorganic crystal structure develops hairline fractures upon bending, which are quite detrimental to the overall electrical performance. To investigate the flexibility of G-CNT electrodes, hydrazine solutions were spin-coated directly on PET substrates. For the densest film, a resistance as low as 44Ω/□ was observed at 55% transmittance after chemical doping. The film's low transmittance is attributed to suboptimal surface morphology. FIGS. 9d and 9e presents the current-voltage characteristics before and after bending of the G-CNT film and a standard ITO on PET electrode for reference. After bending to 60 degrees more than ten times, resistance of the brittle ITO film increased by 3 orders of magnitude, while the G-CNT electrode remained nearly unchanged.

Although G-CNT films perform well during electrical characterization, it is important to understand the feasibility of incorporating this new material in actual optical electronic devices. To this end, we used G-CNT films as a platform for the fabrication of P3HT:PCBM photovoltaic devices. To fabricate the devices, the pre-cleaned glass substrates were subjected to $O_2$ plasma to activate the surface. Subsequent to surface treatment, the hydrophilic substrates were brought into contact with PDMS stamps used for patterning the electrode area. A variety of electrode patterns can be achieved by PDMS with different relief structures as shown FIG. 10a. Typically, a mixture of 1 mg/ml graphene and 10 mg/ml CNTs were used for spin-coating. The electrodes used were coated on glass and exhibited sheet resistances around 600Ω/□ at 87% transmittance. The device structure included a thin PEDOT:PSS buffer layer followed by a 2% 1:1 wt. ratio of P3HT:PCBM spin-coated and "slow-grown" from dichlorobenzene (Li, G. et al. High-efficiency solution processable polymer photovoltaic cells by self-organization of polymer blends. *Nature Materials*, 4, 864-868 (2005)). Finally, thermal evaporation of Al and Ca provided the reflective cathode.

Similar devices have been reported using vapor reduced GO as the bottom electrode, but high resistivity was detrimental to solar cell performance, i.e. reduced short circuit current (Jsc) and fill factor (FF) resulted in a power conversion efficiency (PCE) of 0.2% (Eda, G., Fanchini, G. & Chhowalla, M. Large-area ultrathin films of reduced graphene oxide as a transparent and flexible electronic matrial. *Nature Nanotech*. 3, 270-274 (2008); Eda, G. et al. Transparent and conducting electrodes for organic electronics from reduced graphene oxide. *Applied Phys. Lett*. 92, 233305-233308 (2008)). The device structure and performance characteristics of our PV devices in this example are presented in FIG. 10b. With a device area of 4 mm², power conversion efficiency (PCE) of 0.85% was measured under illumination of 1.5 AM. The Jsc, Voc, and FF were 3.47 mA/cm², 0.583 V, and 42.1% respectively. The low Jsc and FF are detrimental to PCE and likely due to poor contact at the interface between G-CNT and the polymer blend. Further engineering of the electrode morphology will likely improve the diode properties of these devices, and lead to higher PCEs. That said, the performance of these proof-of-concept devices far exceeds those previously reported and are encouraging the development of G-CNT electrodes.

Figure 11:
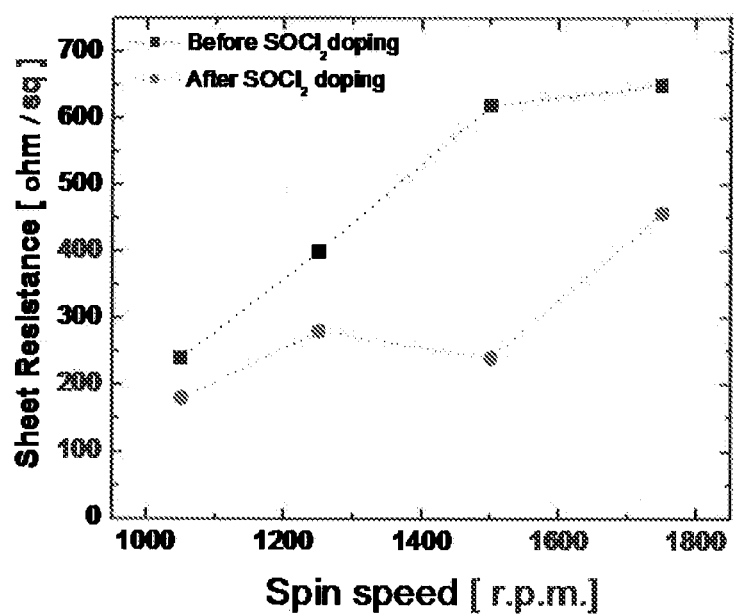
FIG. 11 shows sheet resistance of G-CNT films before (squares) and after (circles) chemical doping. An exposure of 15 minutes to room temperature vapors resulted in a decrease in sheet resistance by a factor of 1.5 to 2 for all deposited films.

Chemical doping has been widely explored as an effective method for increasing the conductivity of CNT electrodes (Rowell, M. W. et al. Organic solar cells with carbon nanotube network electrodes. *Applied Phys. Lett*. 88, 233506-233509 (2006); Pasquier, A. D., Unalan, H. E., Kanwal, A., Miller, S. & Chhowalla, M. Conducting and transparent single-wall carbon nanotube electrodes for polymer-fullerene solar cells. *Applied. Phys. Lett*. 87, 203511-203513 (2005); Eda, G. et al. Transparent and conducting electrodes for organic electronics from reduced graphene oxide. *Applied Phys. Lett*. 92, 233305-233308 (2008); Dettleff-Weglikowska, U. et al. Effect of $SOCl_2$ treatment on electrical and mechanical property of single-wall carbon nanotube networks. *J. Am. Chem. Soc* 127, 5125-5131 (2005)). Simple treatment with $SOCl_2$ vapor is often employed as a means of anion doping and does not significantly affect the optical transmittance of CNT films. We used a similar method for this hybrid system by exposing as deposited G-CNT films to $SOCl_2$ vapors after spin-coating. The sheet resistance before and after treatment is recorded in FIG. 11. An exposure of 15 minutes to room temperature $SOCl_2$ vapors resulted in a decrease in sheet resistance by a factor of 1.5 to 2 for all deposited films. The sheet resistance for the 1,750 RPM film was reduced from 636Ω/□ to 240Ω/□ after doping, while transmittance dropped only slightly from 92 to 91%. To confirm the mechanism of anion doping, similar experiments were performed using $I_2$ vapors and delivered comparable results. These initial doping experiments indicate that further improvements are likely.

According to some embodiments of the current invention, we provide a competitive synthesis approach using a hybrid layer of carbon nanotubes and chemically converted graphene. This technology can be facile, inexpensive, and massively scalable and does not suffer from the shortcomings of ITO. We present conductivity and optical data according to some examples demonstrating comparable performance to the ITO used in flexible applications, 440Ω/□ at 87% transmittance, and also proof-of-principle application in a polymer solar cell with power conversion efficiency (PCE) of 0.85%. Chemical doping show that optimization of this material is not limited to improvements in layer morphology. This versatile material may provide an appropriate transparent electrode for optical electronics.

Transfer Printing

As described above, graphite oxide was isolated and subsequently dispersed directly in anhydrous hydrazine according to some embodiment of the current invention. Carbon nanotubes can also be added to the hydrazine according to some embodiments of the current invention. These methods utilize hydrazine both as a reducing agent and as a solvent according to some embodiment of the current invention. Suspensions in hydrazine have been shown to preserve the integrity of large sheets and tend not to aggregate according to some embodiments of the current invention. After modification by dilution, centrifugation, or ultrasonication, we are able to obtain a variety of controllable surface coverage, almost 95% single sheets in some examples. Prepared depositions were quite uniform, and allow for a range of both densities and sheet sizes. Subsequent to deposition, a transfer printing process enables us to selectively register regions of graphene to designated areas of another substrate. The non-destructive printing process is capable of defining small features and transfering depositions to precise positions on a wafer scale (Chabinyc, M. L.; Salleo, A.; Wu, Y.; Liu, P.; Ong, B. S.; Heeney, M.; McCulloch, I. Lamination Method for the Study of Interfaces in Polymeric Thin Film Transistors *J. Am. Chem. Soc*. 2004, 126, 13928-13929; Arias, A. C.; Ready, S. E.; Lujan, R.; Wong, W. S.; Paul, K. E.; Salleo, A.; Chabinyc, M. L.; Apte, R.; Street, R. A.; Wu, Y.; Liu, P.; Ong, B. All jet-printed polymer thin-film transistor active-matrix backplanes. *Appl. Phys. Lett*. 2004, 85, 3304-3306; Kawase, T.; Sirringhaus, H.; Friend, R. H.; Shimoda, T. Inkjet Printed Via-Hole Interconnections and Resistors for All-Polymer Transistor Circuits *Adv. Mater*. 2001, 13, 1601-1605; Lefenfeld, M.; Blanchet, G.; Rogers, J. High-Performance Contacts in Plastic Transistors and Logic Gates That Use Printed Electrodes of DNNSA-PANI Doped with Single-Walled Carbon Nanotubes *Adv. Mater.* 2003, 15, 1188-1191; Chabinyc, M. L.; Wong, W. S.; Salleo, A.; Kateri, E. P.; Street, R. A. Organic polymeric thin-film transistors fabricated by selective dewetting. *Appl. Phys. Lett.* 2002, 81, 4260-4262). Through this combination of control over hydrazine dispersions, deposition characteristics, and transfer printing, we here demonstrate the first wafer-scale patterning of graphene according to some embodiments of the current invention.

Figures 12A, 12B, 12C, 12D:
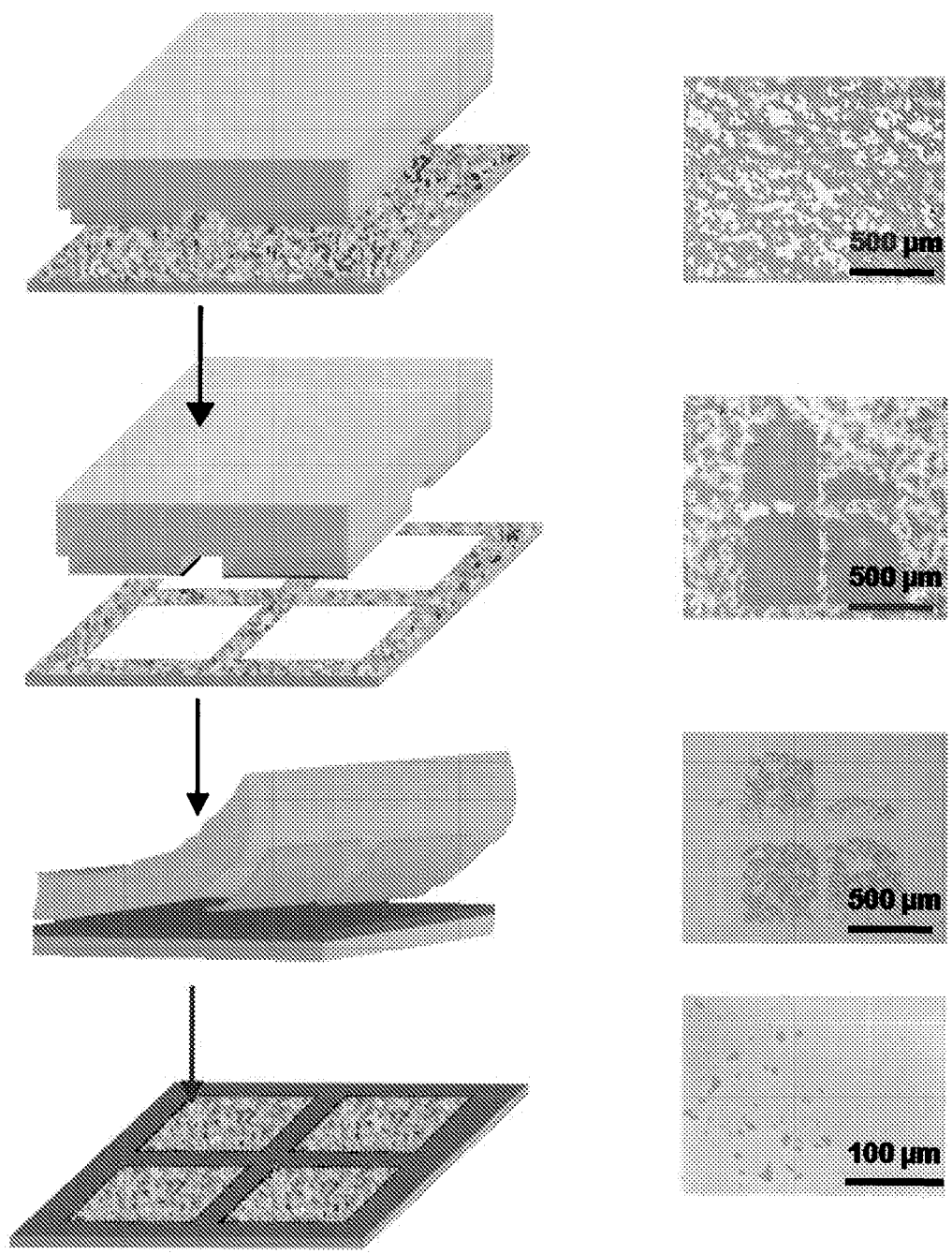
In FIG. 12c the inked stamp is contacted to a heated Si/SiO$_2$ substrate and (FIG. 12d) peeled away to reveal deposited materials.

The transfer mechanism according to some embodiments of the current invention is based on the differing strengths of non-covalent adhesion between the PDMS-graphene and graphene-substrate interfaces. For most materials, the PDMS interface is weaker than the substrate interface, due to the extremely low surface energy of PDMS (19.8 mJ/m$^2$) (Hur, S.-H.; Khang, D.-Y.; Kocabas, C.; Rogers A. J. Nanotranser printing by use of Noncovalent surface forces: applications to thin film transistors that us single walled carbon nanotube networks and semicondcting polymers. *Appl. Phys. Lett.* 2004, 85, 5730-5733). Transferring of single sheet specimens by a PDMS stamp is depicted in FIG. 12. The process according to some embodiments of the current invention begins by spin-coating hydrazine suspensions onto an oxygen plasma treated glass substrate, followed by a thermal annealing process to remove solvent and hydrazinium cations. An optical image of the resulting deposition on glass is provided on the right-hand side of FIG. 12*a*.

Glass substrates were brought into contact with a patterned PDMS as shown in FIG. 12*b*. In this case, the stamp was designed with three raised rectangles. Proper pressure was used to ensure intimate contact, which was maintained for 2 minutes for complete transfer. The hydrophobic surface of pristine PDMS interacts more strongly with graphene than does the initial glass substrate, which allows transfer to take place. Graphene registered PDMS stamps were then quickly peeled from the glass substrate. An optical image after peeling clearly shows that material has been removed in the rectangular areas of contact (FIG. 12*b*, right).

"Inked" stamps were next carefully brought into contact with 300 nm Si/SiO$_2$ substrates (FIG. 12*c*). A contact time of several days was necessary to fully transfer single sheets from PDMS to Si/SiO$_2$ substrates at room temperature. Transfer proceeds as low molecular weight oligomers are dissociated from the surface of the stamp over time, releasing the graphene sheets (Briseno, A. L.; Roberts, M.; Ling, M.-M.; Moon, H.; Nemanick, E. J.; Bao, Z. Patterning organic semiconductors using "dry" poly(dimethylsiloxane) elastomeric Stamps for thin film transistors. *J. Am. Chem. Soc.* 2004, 126, 13928-13929; Glasmastar, K.; Gold, J.; Andersson, A.; Sutheland, D. S.; Kasemo, B. Silicone Transfer during microcontact printing. *Langmuir* 2003, 19, 5475-5483; Li, X.-M.; Peter, M.; Huskens, J.; Reinhoudt, D. N. Catalytic microcontact printing without ink. *Nano lett.* 2003, 3, 1449-1453). With the assistance of heat, oligomers are more quickly dissociated from the PDMS stamp, allowing full transfer in 2h at 50° C. and 30 min at 75° C. Heating also facilitates reorientation and segmental motion, which further weakens the interface between graphene and PDMS. The stamp is finally removed from the Si/SiO$_2$ substrate, leaving behind the rectangular pattern of graphene as shown in bright-field (FIG. 12*c*, right) microscope images.

Characterization of Transfer

Figure 13A:
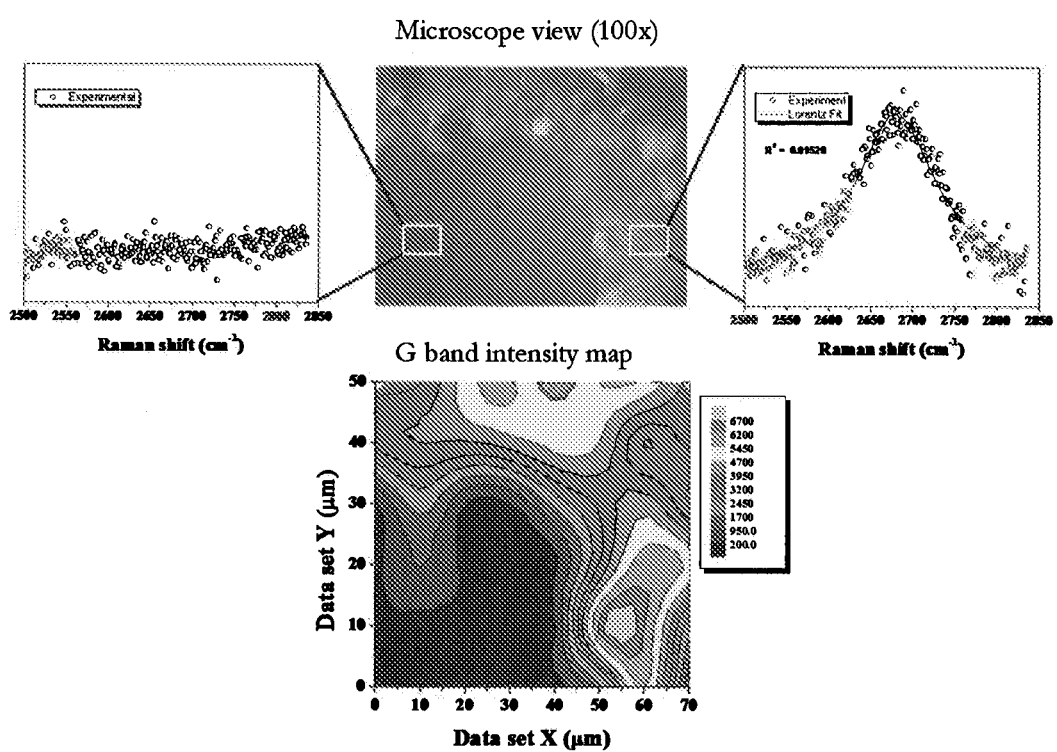
FIG. 13 shows Micro Raman spectra that were collected inside and outside of a rectangular region on (FIG. 13a) glass and (FIG. 13b) Si/SiO$_2$ according to an embodiment of the current invention. Raman intensity mapping of the G peak indicates that graphene has been completely removed from a section of the glass by the PDMS stamp and successfully deposited onto a Si/SiO$_2$ substrate. Representative spectra are provided for spots both inside and outside of the rectangular regions showing the G' peak of graphitic carbon.
Figure 13B:
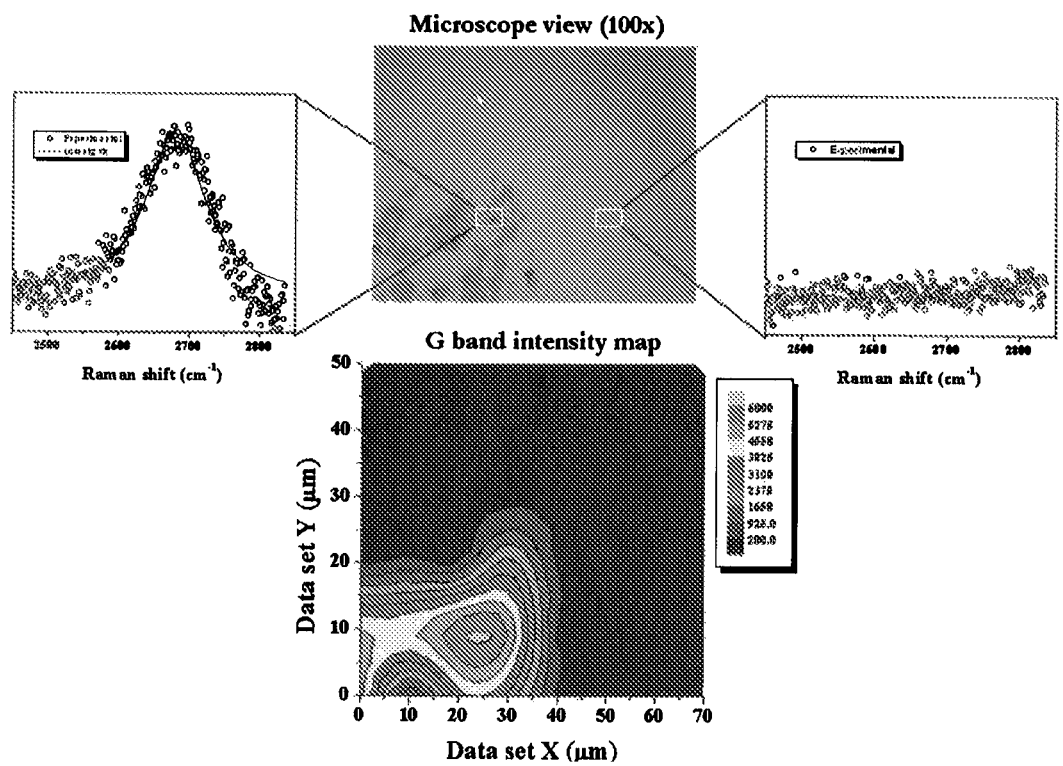

Although the initial characterization of a deposition was carried out optically, more sophisticated techniques are necessary to understand the extent to which transfer has taken place. FIG. 13 presents optical images and the corresponding G band Raman intensity maps of both the glass (FIG. 13*a*) and Si/SiO$_2$ (FIG. 13*b*) substrates used during the transfer process. The G band at 1584 cm$^{-1}$ results from the E$_{2g}$ vibrational mode in graphene and is not observed on a clean Si/SiO$_2$ surface (Ferrari, A. C.; Meyer, J. C.; Scardaci, V.; Casiraghi, C.; Lazzeri, M.; Mauri, F.; Piscanec, S.; Jiang, D.; Novoselov, K. S.; Roth S.; Geim, A. K.; Raman spectrum of Graphene and graphene layers. *Phys. Rev. Lett.* 2006, 97, 87401-187404; Tuinstra, F.; Koenig, J. L.; Raman spectrum of graphite. *J. Chem. Phys.* 1970, 53, 1126-1130; Gupta, A.; Chen, G.; Joshi, P.; Tadigadapa, S.; Eklundi, P. C.; Raman scattering from high-frequency phonons in supported n-graphene layer films. *Nano Lett.* 2006, 6, 2667-2673; Graf, D.; Molitor, F.; Ensslin, K.; Stampfer, C.; Jungen, A.; Hierold, C.; Wirtz, L.; Spatially Resolved raman spectroscopy of single- and few-layer graphene. *Nano Lett.* 2007, 7, 238-242). A G band intensity map for the glass substrate (FIG. 13*a*) clearly shows that graphitic materials have been almost completely removed from the rectangular region that contacted the PDMS stamp. The removed region has well defined borders, including a nearly right angle at the upper right-hand side. A G band intensity map for the Si/SiO$_2$ substrate (FIG. 13*b*) indicates a well-defined rectangular region of transferred graphitic material, closely resembling the PDMS stamp features.

Removal of PDMS Residue

Figure 14A:
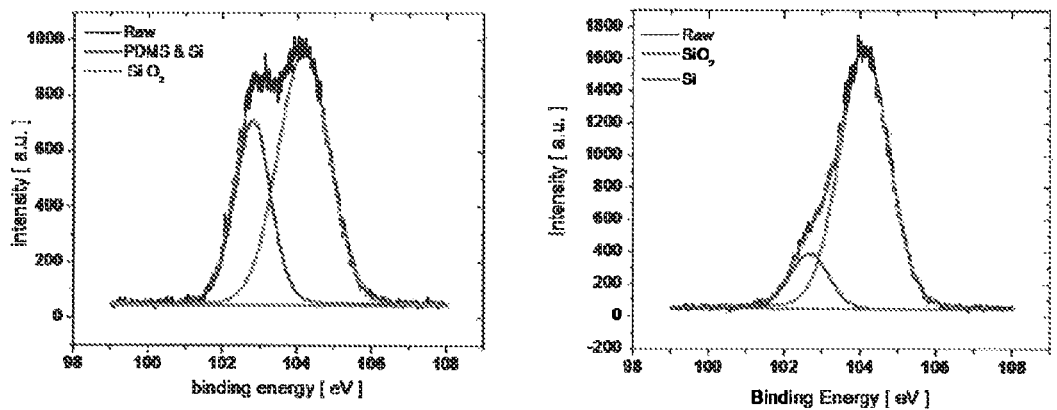
FIG. 14a Si 2p and FIG. 14b C 1s spectra show the removal of residual PDMS upon thermal annealing to 400° C. for 1 hour. The peak shifts of nearly 1 eV for Si and SiO$_2$ are attributed to a charging effect from the thick insulating oxide.
Figure 14B:
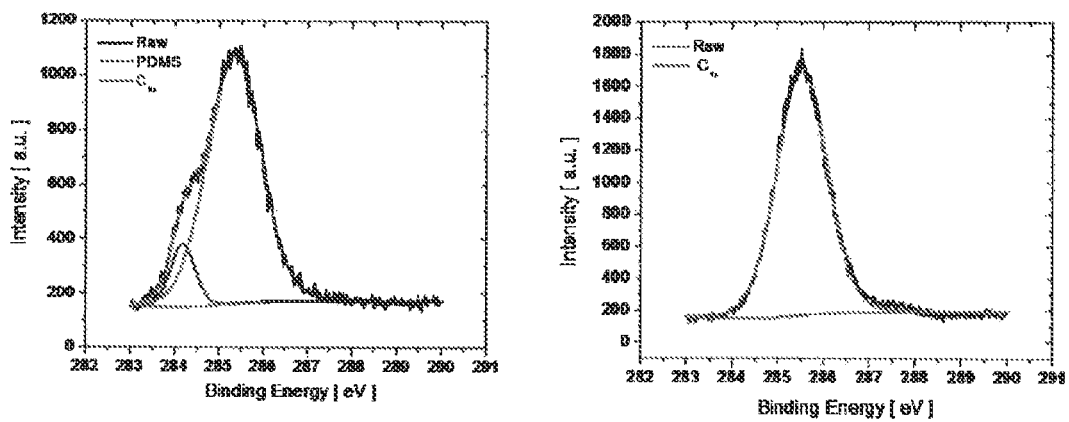

Although they are not visible in the Raman spectra, our understanding of the PDMS transfer process suggests that there are likely dimethylsiloxane oligomers deposited along with graphene. This is often the case with transfer printing, but could represent a problem for subsequent fabrication techniques (Glasmastar, K.; Gold, J.; Andersson, A.; Sutheland, D. S.; Kasemo, B. Silicone Transfer during microcontact printing. *Langmuir* 2003, 19, 5475-5483; Li, X.-M.; Peter, M.; Huskens, J.; Reinhoudt, D. N. Catalytic microcontact printing without ink. *Nano lett.* 2003, 3, 1449-1453). In order to remove oligomers, we thermally annealed the deposited material at 400° C. for 1 hour. FIG. 14 shows Si 2p (top) and C 1s (bottom) XPS spectra from the deposited region both before and after annealing. The Si peak is predominately Si/SiO$_2$, but displays a large shoulder consistent with dimethylsiloxane before the annealing process. The shoulder was nearly gone after heating at 100° C. and entirely removed after annealing at 400° C. for 1 hour, indicating complete removal of PDMS residue. The shift of peaks identified as SiO$_2$ at 104.4 eV and PDMS at 102.6 eV is attributed to a charging effect by the thick insulating layer of SiO$_2$ (300 nm) (Glasmastar, K.; Gold, J.; Andersson, A.; Sutheland, D. S.; Kasemo, B. Silicone Transfer during microcontact printing. *Langmuir* 2003, 19, 5475-5483). The carbon signal does not change before and after the process, an indication that annealing did not alter the deposited graphene. If anything, the heat treatment may increase the graphitization of single sheets, as has been indicated by other groups (Becerril, H.; Mao, J.; Liu, Z.; Stoltenberg, R.; Bao, Z.; and Chen, Y.; Evaluation of solution-processed reduced graphene oxide films as transparent conductors. Nano ASAP).

Characterization of Single Sheets

Figures 15A, 15B, 15C, 15D, 15E, 15F:
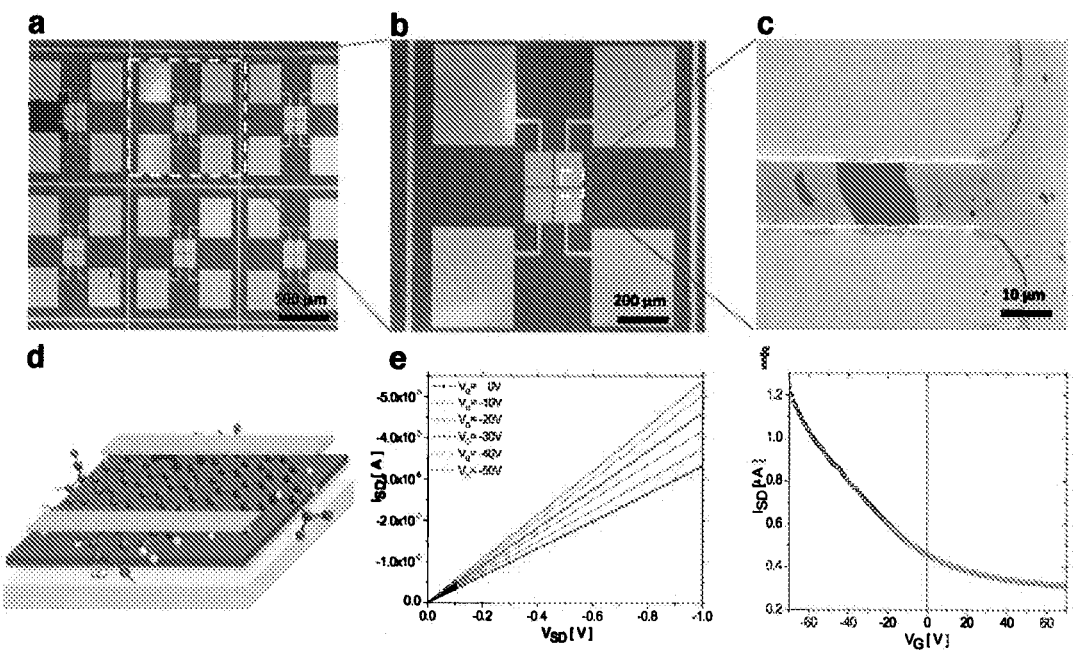
FIGS. 15a and 15b show optical images of the geometric layout of field effect devices according to an embodiment of the current invention. Gold electrodes are patterned via conventional photolithography to form top-contacts on the Si/SiO$_2$ substrate.
In FIG. 15c an SEM image verifies a single sheet of graphene (dark region) bridges the electrodes (top and bottom).
FIG. 15d is a schematic illustration showing the structure of the fabricated devices according to this embodiment of the current invention.
FIG. 15e shows $I_{SD}$-$V_{SD}$ measurements and FIG. 15f shows $I_{SD}$-$V_G$ transfer curves indicating current modulation under negative gate bias in this example.

The electrical properties of deposited materials were confirmed by the fabrication of field-effect devices. Briefly, gold electrodes were patterned via a conventional photolithographic lift-off process, with electrode separation lengths of 7 microns. Optical images of the fabricated devices are provided at 10× and 20× magnification in FIGS. 15*a* and 15*b*, respectively. After evaporation, an SEM was used to identify single sheet devices as depicted in FIG. 15*c*. Gate voltages were supplied via the Si substrate, providing $I_{SD}$-$V_{SD}$ characteristics as depicted in FIG. 15e. As shown in the figure, deposited graphene materials increase in conductivity under negative gating conditions, indicating p-type behavior. FIG. 15f shows a transfer curve ($I_{SD}$-$V_G$) collected at a $V_{SD}$ of 100 mV. These observations agree well with others of chemically derived graphene.

Figure 16A:
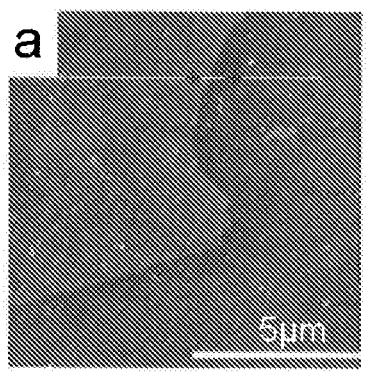
FIG. 16 shows an atomic force microscope image and the corresponding line-scan that confirm a step height of less than 1 nm, indicative of single sheet graphene according to this embodiment of the current invention.
Figure 16B:
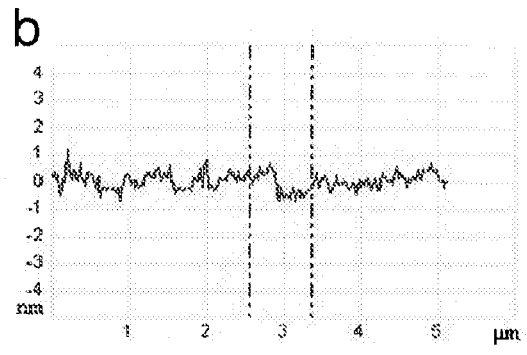

Atomic force microscopy (AFM) was also used to confirm the edge step heights of graphene sheets. FIG. 16 shows an AFM image collected in tapping mode and a corresponding line-scan, which indicates a step height of less than 1 nm. Although the theoretical thickness of pristine graphene is 0.34 nm, measurements rarely approach this number even in ultra-high vacuum settings (Gomez-Navarro, C.; Weitz, R. T., Bittner, A. M.; Scolari, M.; Mews, A.; Burghrd, M.; Kern, K. Electronic transport properties of individual chemically reduced graphene Oxide Sheets *Nano lett.* 2007, 7, 3499-3503; Gilje, S.; Han, S.; Wang, M. S.; Wang, K. L.; Kaner, R. B.; A chemical route to graphene for device applications. *Nano lett.* 2007, 7, 3394-3398; Gomez-Navarro, C., Weitz R., Bittner, A. M., Scolari, M., Mews A., Burghard, M, and Kern, K. Electronic Transport Properties of Individual Chemically Reduced Graphene Oxide Sheets *Nano lett.* 2007, 7, 3499-3503). In our case, AFM images were collected under ambient conditions, where adsorbed water and gas molecules typically result in step heights around 1 nm for both pristine and chemically derived graphene.

EXPERIMENTAL

Preparation of Graphene Dispersions

Graphite oxide (GO) was prepared from graphite powder via the Hummer's method. Resultant dispersions were 2% w/v in water and diluted to 1 mg/L for use. GO was then filtered through a 0.22 micron alumina membrane in order to create a thin film, which was allowed to dry for 24 hours under ambient conditions and then carefully peeled from the membrane.

The GO film was matte black in color and physically robust. Elemental analysis was performed at this stage, yielding a C:O:N ratio of approximately 4:3:0. A small piece of the GO film (~1 mg) was transferred into a nitrogen filled dry box, and added to 1 mL of anhydrous hydrazine for reduction and dispersion. Upon contact, a gaseous product was seen bubbling from the surface of the film, likely $N_2$ evolved during the reduction process. During this bubbling, the film could be seen breaking down and the hydrazine underwent a change from clear to a dark black color, indicating the dispersion of reduced graphite oxide. The hydrazine dispersions likely contain hydrazinium graphene (HG) due to the formation of a counter-ion pair during reduction (Mitzi B. D.; Copel M.; Chey S. J.; Low-Voltage Transistor Employing a High-mobility spin-coated chalcogenide semiconductor. *Adv Mater.* 2005, 17, 1289-1293). After 24 hours of stirring, no residual film could be observed. Elemental analysis of HG was performed by evaporating the solvent under streaming nitrogen, producing a dry, shiny black material that yielded a C:O:N ratio of approximately 8:1:1.5.

HG dispersions were stable and allowed to stir for up to several months in a covered vial before deposition. Further treatment of HG suspensions was carried out just before spin-coating, and differed according to the desired level of surface coverage. A Heraeus Labofuge 400 was used for centrifugation, which removed any aggregates prior to spin-coating. Sonication was carried out using a VWR model 250D sonicator set at level 9 for 10 min.

Preparation of Films $Si/SiO_2$ substrates were cleaned in piranha solution and pre-treated for 2 minutes by an oxygen plasma in order to ensure good wetting by hydrazine. Substrates were transferred into the dry box and spin-coated within 15 minutes of this pre-treatment. After deposition, films were baked to 115° C. to remove residual hydrazine and then to 350° C. in order to remove hydrazinium ions. Elemental analysis carried out on the final material produced a C:O:N ratio of 12:1:0.7, confirming the removal of nitrogen-containing species.

In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. An electrode for an electrical, electronic or electro-optic device, comprising:
    a plurality substantially planar graphene-based structures; and
    a plurality of carbon nanotubes which are in electrical connection with at least two of said plurality of substantially planar graphene-based structures,
    wherein said substantially planar graphene-based structures are each single-sheet graphene-based structures having an area of at least 1 $\mu m^2$,
    wherein said plurality of carbon nanotubes provide electrical connection between otherwise electrically isolated substantially planar graphene-based structures, and
    wherein said graphene-based structures have a carbon to oxygen atomic ratio of at least 12:1.

2. An electrode according to claim 1, wherein said electrode has a thickness selected in accordance with a preselected electrical conductivity for said electrode.

3. An electrode according to claim 1, further comprising at least one of semiconducting nanorods or conducting nanorods.

4. An electrode according to claim 1, further comprising a layer of an electrically conducting material in addition to a layer formed by said substantially planar graphene-based structures and said carbon nanotubes to provide at least a two layer electrode.

5. An electrode according to claim 1, wherein said electrode is sufficiently transparent to electromagnetic radiation in an operating range of wavelengths of an electro-optic device to be used as a transparent electrode.

6. An electrical, electronic or electro-optic device comprising an electrode, said electrode comprising:
    a plurality substantially planar graphene-based structures; and
    a plurality of carbon nanotubes which are in electrical connection with at least two of said plurality of substantially planar graphene-based structures,
    wherein said substantially planar graphene-based structures are each single-sheet graphene-based structures having an area of at least 1 $\mu m^2$, wherein said plurality of carbon nanotubes provide electrical connection between otherwise electrically isolated substantially planar graphene-based structures, and wherein said graphene-based structures have a carbon to oxygen atomic ratio of at least 12:1.

7. An electrode according to claim 6, further comprising at least one of semiconducting nanorods or conducting nanorods.

8. An electrical, electronic or electro-optic device according to claim 6, said electrode further comprising a layer of an electrically conducting material in addition to a layer formed by said substantially planar graphene-based structures and said carbon nanotubes to provide at least a two layer electrode.

9. An electrical, electronic or electro-optic device according to claim 6, wherein said electrode is sufficiently transparent to electromagnetic radiation in an operating range of wavelengths of an electro-optic device to be used as a transparent electrode.

10. An electrical, electronic or electro-optic device according to claim 6, wherein said electrical, electronic or electro-optic device is at least one of a capacitor, a supercapacitor, a diode, a light emitting diode, a photodiode, a transistor, a photovoltaic cell, a battery, a display device, a field emission display, or an assembly incorporating any combination thereof.

11. A composition comprising a matrix material and graphene-based structures,
wherein the graphene-based structures are produced according to a method comprising:
dissolving a graphitic material in an anhydrous solvent to provide a suspension of carbon-based macro-molecular structures in said solvent; and
obtaining a plurality of said graphene-based structures from said suspension,
wherein said plurality of graphene-based structures obtained from said suspension each consists essentially of carbon,
wherein the graphene-based structures are blended with said matrix material,
wherein said graphene-based structures act to alter at least one of an electrical, structural or mechanical property of said matrix material,
wherein said graphene-based structures are each single-sheet graphene-based structures having an area of at least 1 $\mu m^2$, and
wherein said graphene-based structures have a carbon to oxygen atomic ratio of at least 12:1.

12. A composition according to claim 11, wherein said matrix material is a polymer.

13. A composition according to claim 11, wherein said matrix material is a polymer composite.

14. A composition according to claim 11, wherein said matrix material is a conducting polymer.

15. A composition according to claim 11, wherein said composition is for use in electronic devices.

16. A composition according to claim 11, wherein said composition is for use in mechanical devices.

17. A composition according to claim 11, wherein said graphene-based structures are each single-sheet graphene-based structures having an area of at least 20 $\mu m^2$.

18. A composition according to claim 11, wherein said composition further comprises a plurality of carbon nanotubes, and
wherein said plurality of carbon nanotubes provide electrical connection between at least some of said single-sheet graphene-based structures.

19. A composition according to claim 18, wherein said composition is suitable to be formed into a transparent electrode having a transparency of at least 55% at an operating wavelength and a sheet resistance less than 700Ω/□.

20. A composition according to claim 18, wherein said composition is suitable to be formed into a transparent electrode having a transparency of at least 55% at an operating wavelength and a sheet resistance less than 44Ω/□.

21. A composition according to claim 18, wherein said composition is suitable to be formed into a transparent electrode having a transparency of at least 87% at an operating wavelength and a sheet resistance less than 600Ω/□.

22. A composition, comprising:
a matrix material; and
graphene-based structures blended with said matrix material,
wherein said graphene-based structures act to alter at least one of an electrical, structural or mechanical property of said matrix material,
wherein said graphene-based structures are each single-sheet graphene-based structures having an area of at least 1 $\mu m^2$, and
wherein said graphene-based structures have a carbon to oxygen atomic ratio of at least 12:1.

23. A composition according to claim 22, wherein said graphene-based structures are each single-sheet graphene-based structures having an area of at least 20 $\mu m^2$.

24. A composition according to claim 22, further comprising:
a plurality of carbon nanotubes blended with said matrix material,
wherein said plurality of carbon nanotubes provide electrical connection between at least some of said single-sheet graphene-based structures.

25. A composition according to claim 24, wherein said composition is suitable to be formed into a transparent electrode having a transparency of at least 55% at an operating wavelength and a sheet resistance less than 700Ω/□.

26. A composition according to claim 24, wherein said composition is suitable to be formed into a transparent electrode having a transparency of at least 55% at an operating wavelength and a sheet resistance less than 44Ω/□.

27. A composition according to claim 24, wherein said composition is suitable to be formed into a transparent electrode having a transparency of at least 87% at an operating wavelength and a sheet resistance less than 600Ω/□.

28. A composition according to claim 11, wherein said graphene-based structures further comprise nitrogen such that a carbon to nitrogen atomic ratio is within the range of 8:1.5 to 12:0.7.

29. A composition according to claim 22, wherein said graphene-based structures further comprise nitrogen such that a carbon to nitrogen atomic ratio is within the range of 8:1.5 to 12:0.7.

* * * * *